United States Patent
Shimura et al.

(10) Patent No.: US 8,075,730 B2
(45) Date of Patent: Dec. 13, 2011

(54) APPARATUS FOR MANUFACTURING A SEMICONDUCTOR DEVICE

(75) Inventors: Satoru Shimura, Nirasaki (JP); Kazuhiro Kubota, Nirasaki (JP); Ryuichi Asako, Nirasaki (JP); Seiichi Takayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 949 days.

(21) Appl. No.: 11/631,387

(22) PCT Filed: Jun. 29, 2005

(86) PCT No.: PCT/JP2005/011973
§ 371 (c)(1), (2), (4) Date: Dec. 29, 2006

(87) PCT Pub. No.: WO2006/003948
PCT Pub. Date: Jan. 12, 2006

(65) Prior Publication Data
US 2008/0057728 A1  Mar. 6, 2008

(30) Foreign Application Priority Data

Jul. 2, 2004 (JP) .................... 2004-196698
Dec. 10, 2004 (JP) .................... 2004-358609

(51) Int. Cl.
*C23F 1/00* (2006.01)
*H01L 21/306* (2006.01)
*C23C 16/00* (2006.01)

(52) U.S. Cl. ......... 156/345.32; 156/345.24; 156/345.31; 118/719

(58) Field of Classification Search ............... 118/718; 156/345.31, 345.32; 414/935–941
See application file for complete search history.

(56) References Cited

U.S. PATENT DOCUMENTS

| | | | | |
|---|---|---|---|---|
| 5,934,856 | A | * | 8/1999 | Asakawa et al. ............. 414/217 |
| 6,001,739 | A | * | 12/1999 | Konishi ....................... 438/692 |
| 6,576,562 | B2 | | 6/2003 | Ohuchi et al. |
| 6,607,986 | B2 | | 8/2003 | Seta et al. |
| 6,987,066 | B2 | | 1/2006 | Seta et al. |
| 7,396,769 | B2 | | 7/2008 | Hudson et al. |

FOREIGN PATENT DOCUMENTS

| | | | |
|---|---|---|---|
| JP | 2000 188331 | | 7/2000 |
| JP | 2000347406 A | * | 12/2000 |
| JP | 2002 83869 | | 3/2002 |
| JP | 2003 282698 | | 10/2003 |
| JP | 2004-29696 | | 1/2004 |

OTHER PUBLICATIONS

Mor, Y. S. et al., "Effective Repair to Ultra-Low-k Dielectric Material (k~2.0) by Hexamethyldisilazane Treatment", J. Vac. Sci. Technol. B 20(4), vol. 20, No. 4, pp. 1334-1338, 2002.

(Continued)

*Primary Examiner* — Karla Moore
(74) *Attorney, Agent, or Firm* — Oblon, Spivak, McClelland, Maier & Neustadt, L.L.P.

(57) ABSTRACT

In a semiconductor device manufacturing method, an etching mask (75*b*) having a predetermined opening pattern is formed on an etching target film (74) disposed on a target object. Then, an etching process is performed on the etching target film (74) through the opening pattern of the etching mask (75*b*) within a first process chamber, thereby forming a groove or hole (78*a*) in the etching target film. Then, the target object treated by the etching process is transferred from the first process chamber to a second process chamber, within a vacuum atmosphere. Then, a silylation process is performed on a side surface of the groove or hole (78*a*), which is an exposed portion of the etching target film (74), within the second process chamber.

18 Claims, 20 Drawing Sheets

OTHER PUBLICATIONS

Chang, T.C. et al.,"Recovering Dielectric Loss of Dielectric Constant Organic Siloxane During the Photoresisit Removal Process", Journal of the Electrochemical Society, vol. 149, No. 8, pp. F81-F84, 2002.

U.S. Appl. No. 11/840,767, filed Aug. 17, 2007, Asako, et al.
Office Action issued Nov. 8, 2010 in Taiwan Application No. 094119874 (With English Translation).

* cited by examiner

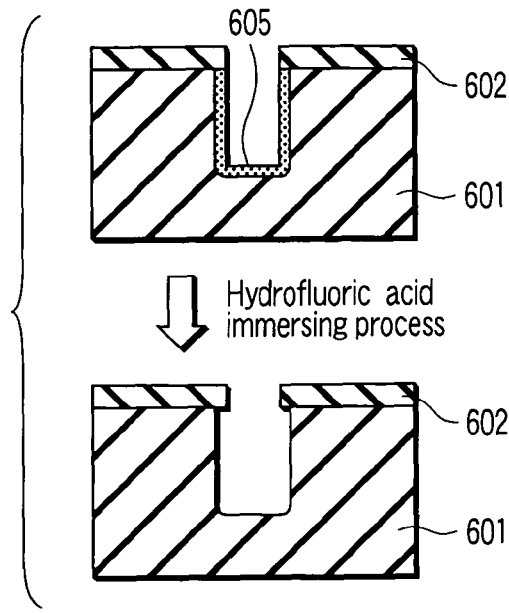
F I G. 16A
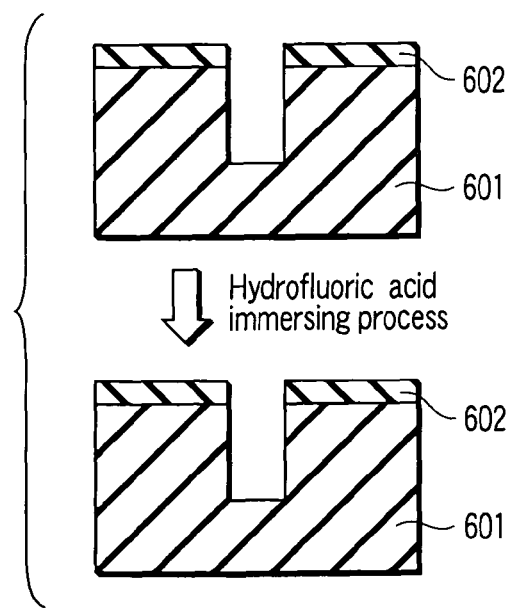
F I G. 16B

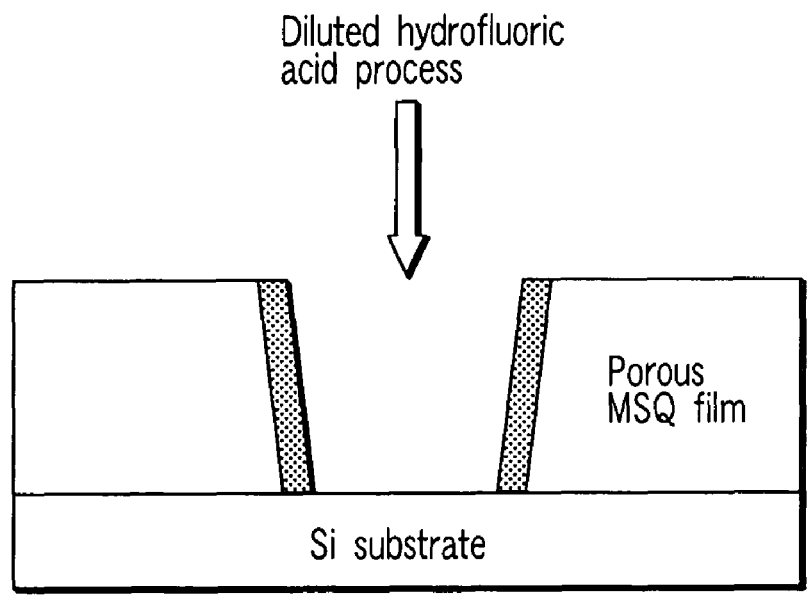
F I G. 19A
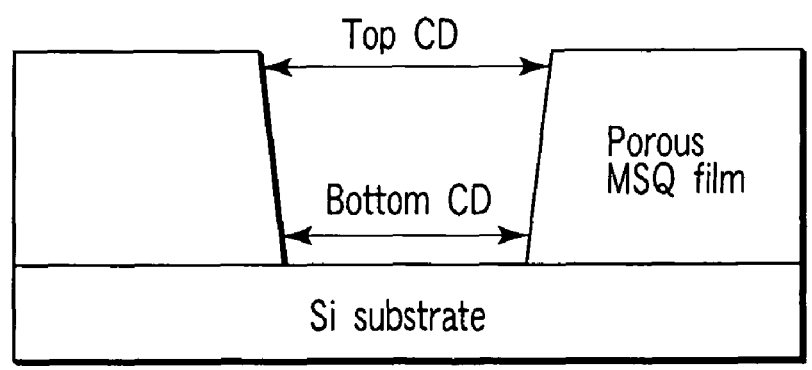
F I G. 19B

APPARATUS FOR MANUFACTURING A SEMICONDUCTOR DEVICE

CROSS-REFERENCE TO RELATED APPLICATIONS

This is a U.S. national phase application under 35 U.S.C. §371 of International Application PCT/JP2005/011973 (not published in English), filed Jun. 29, 2005.

TECHNICAL FIELD

The present invention relates to a method of manufacturing a semiconductor device, and particularly to an improvement of a method of forming an interconnection groove or connection hole used in a semiconductor device. Such interconnection groove or connection hole is utilized in forming a multi-layer interconnection structure by use of, e.g., a single damascene method or dual damascene method.

BACKGROUND ART

In semiconductor device manufacturing processes, a dual damascene method is frequently used for forming a multi-layer interconnection structure (for example, see Jpn. Pat. Appln. KOKAI Publication No. 2002-83869). FIG. 20 comprises sectional views schematically showing sequentially ordered steps of a conventional process for forming an interconnection structure by use of a dual damascene method.

At first, for example, an interconnection layer 500, an inter-level insulating film 501, and an anti-reflective coating 502 are formed in this order on a substrate. Further, a first resist film 503 is formed on the surface of the multi-layer structure thus formed (FIG. 20, (a)). Then, patterning of the first resist film 503 is performed by a photolithography technique to form a predetermined pattern (FIG. 20, (b)). In this patterning step, the first resist film 503 is subjected to light exposure with a predetermined pattern, and the light-exposed portion is selectively removed by development. Subsequently, the anti-reflective coating 502 and inter-level insulating film 501 are etched by an etching process using the first resist film 503 as a mask. Consequently, a connection hole 504 is formed to extend from the surface of the multi-layer structure to the interconnection layer 500 (FIG. 20, (c)).

Thereafter, for example, the first resist film 503, which is not necessary any more, is peeled off and removed by an ashing process (FIG. 20, (d)). Then, a new second resist film 505 for forming an interconnection groove is formed (FIG. 20, (e)). Then, patterning of the second resist film 505 is performed by a photolithography technique (FIG. 20, (f)). Then, parts of the anti-reflective coating 502 and the inter-level insulating film 501 are etched by an etching process using the second resist film 505 as a mask. Consequently, an interconnection groove 506 is formed to be connected to the connection hole 504 and wider than the connection hole 504 (FIG. 20, (g)). Then, the second resist film 505, which is not necessary any more, is peeled off and removed (FIG. 20, (h)). Then, the connection hole 504 and interconnection groove 506 are filled with Cu material, so that a Cu interconnection line (including an interconnection layer and a via-plug) 507 is formed (FIG. 20, (i)).

In recent years, for interconnection structures of this kind, low dielectric constant materials (Low-k materials) including alkyl groups, such as methyl groups, as end groups are used as the material of the inter-level insulating film 501. In this case, etching damage tends to be caused to the inner surface portion of the connection hole 504 or interconnection groove 506, which has been formed by etching the inter-level insulating film 501. Further, when the first resist film 503 and second resist film 505 are removed after the etching process, the inner surface portion of the connection hole 504 or interconnection groove 506 is damaged. Due to this damage, the parasitic capacitance between interconnection lines is increased (due to an increase in dielectric constant), so a signal delay occurs and electrical characteristics, such as insulation resistance, are deteriorated. These problems bring about deterioration in the reliability of semiconductor devices, as circuit patterns used in semiconductor devices are increasingly miniaturized and highly integrated.

DISCLOSURE OF INVENTION

An object of the present invention is to provide a method of manufacturing a semiconductor device with improved electrical characteristics and reliability.

According to a first aspect of the present invention, there is provided a semiconductor device manufacturing method comprising: forming an etching mask having a predetermined opening pattern on an etching target film disposed on a target object; performing an etching process on the etching target film through the opening pattern of the etching mask within a first process chamber, thereby forming a groove or hole in the etching target film; transferring the target object treated by the etching process from the first process chamber to a second process chamber, within a vacuum atmosphere; and performing a silylation process on a side surface of the groove or hole, which is an exposed portion of the etching target film, within the second process chamber.

According to a second aspect of the present invention, there is provided a semiconductor device manufacturing method comprising: forming an etching mask having a predetermined opening pattern on an etching target film disposed on a target object; performing an etching process on the etching target film through the opening pattern of the etching mask within a process chamber, thereby forming a groove or hole in the etching target film; and performing a silylation process on a side surface of the groove or hole, which is an exposed portion of the etching target film, within the process chamber.

According to a third aspect of the present invention, there is provided a semiconductor device manufacturing method comprising: forming an etching mask having a predetermined opening pattern on an etching target film disposed on a target object; performing an etching process on the etching target film through the opening pattern of the etching mask, thereby forming a groove or hole in the etching target film; performing an ashing process on the etching mask after the etching process, thereby removing the etching mask from the target object; and performing a silylation process on a side surface of the groove or hole, which is an exposed portion of the etching target film, after the ashing process.

According to a fourth aspect of the present invention, there is provided a semiconductor device manufacturing method comprising: forming an etching mask having a predetermined opening pattern on an etching target film disposed on a target object; performing an etching process on the etching target film through the opening pattern of the etching mask, thereby forming a groove or hole in the etching target film; performing a cleaning process using a chemical solution on the target object after the etching process; and performing a silylation process on a side surface of the groove or hole, which is an exposed portion of the etching target film, after the cleaning process.

According to a fifth aspect of the present invention, there is provided a semiconductor device manufacturing method comprising: forming an inter-level insulating film on an etching stopper film disposed on a target object; forming a groove or hole in the inter-level insulating film to reach the etching stopper film; performing an etching process on the etching stopper film through the groove or hole of the inter-level insulating film, thereby removing a portion of the etching stopper film present at a bottom of the groove or hole; and performing a silylation process on a side surface of the groove or hole, which is an exposed portion of the inter-level insulating film, after the etching process.

According to a sixth aspect of the present invention, there is provided a semiconductor device manufacturing system comprising: a first process chamber configured to accommodate a target object that comprises an etching target film and an etching mask formed thereon and including a predetermined opening pattern; an etching mechanism configured to perform an etching process on the etching target film through the opening pattern of the etching mask within the first process chamber, so as to form a groove or hole in the etching target film; a second process chamber configured to accommodate the target object after the target object is processed in the first process chamber; a silylation mechanism configured to perform a silylation process on a side surface of the groove or hole, which is an exposed portion of the etching target film, within the second process chamber; a vacuum transfer passage connecting the first and second process chambers to each other; and a transfer mechanism disposed in the vacuum transfer passage and configured to transfer the target object from the first process chamber to the second process chamber.

According to a seventh aspect of the present invention, there is provided a semiconductor device manufacturing system comprising: a process chamber configured to accommodate a target object that comprises an etching target film and an etching mask formed thereon and including a predetermined opening pattern; an etching mechanism configured to perform an etching process on the etching target film through the opening pattern of the etching mask within the process chamber, so as to form a groove or hole in the etching target film; and a silylation mechanism configured to perform a silylation process on a side surface of the groove or hole, which is an exposed portion of the etching target film, within the process chamber.

According to an eighth aspect of the present invention, there is provided a computer readable medium containing program instructions for execution on a processor, which, when executed by the processor, cause a semiconductor device manufacturing system to execute the manufacturing method according to any one of the first to fifth aspects.

BRIEF DESCRIPTION OF DRAWINGS

FIG. 16A comprises sectional views showing a change in the shape of a groove caused by a hydrofluoric acid immersing process where the groove has not been treated by a silylation process;

FIG. 16B comprises sectional views showing a change in the shape of a groove caused by a hydrofluoric acid immersing process where the groove has been treated by a silylation process;

FIG. 19A is a view showing a test sample before a corrosion resistance test using immersion in diluted hydrofluoric acid;

FIG. 19B is a view showing the test sample after the corrosion resistance test using immersion in diluted hydrofluoric acid.

BEST MODE FOR CARRYING OUT THE INVENTION

Embodiments of the present invention will now be described with reference to the accompanying drawings. Hereinafter, the present invention is exemplified by a wafer processing system in which a semiconductor device is manufactured by a single damascene method or dual damascene method. Where an interconnection structure is formed by a single damascene method or dual damascene method, an interconnection groove or connection hole (which will be referred to as "interconnection groove or the like" hereinafter) is utilized.

Figure 1:
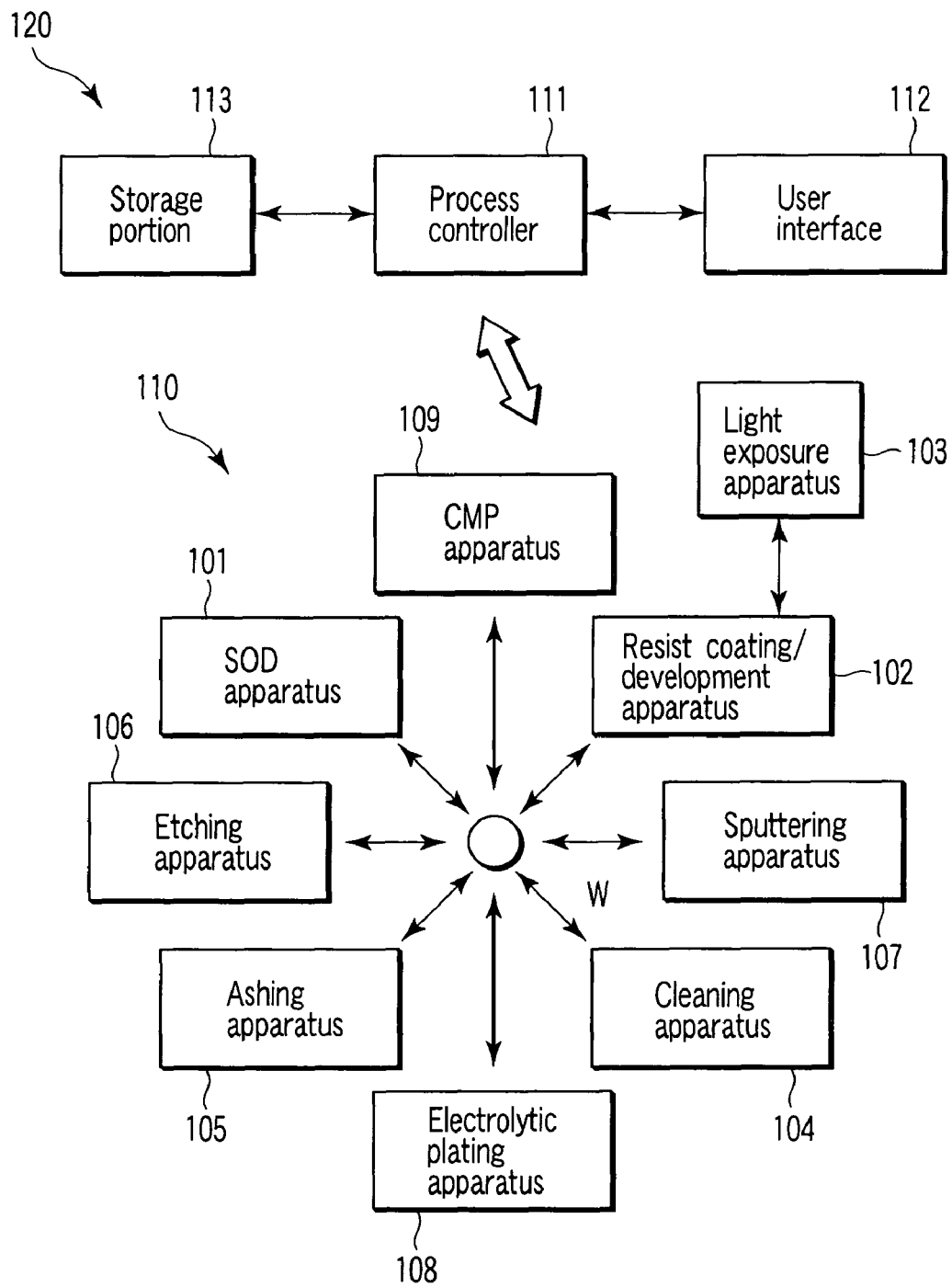
FIG. 1 is an explanatory view schematically showing the arrangement of a wafer processing system.

FIG. 1 is an explanatory view schematically showing the arrangement of a wafer processing system. This wafer processing system includes a process section 110 and a main control section 120. The process section 110 includes an SOD (Spin On Dielectric) apparatus 101, a resist coating/development apparatus 102, a light exposure apparatus 103, a cleaning apparatus 104, an ashing apparatus 105, an etching apparatus 106, a sputtering apparatus 107 used as a PVD apparatus, an electrolytic plating apparatus 108, and a CMP apparatus 109 used as a polishing apparatus. The main control section 120 includes a process controller 111, a user interface 112, and a storage portion 113. The SOD apparatus 101, sputtering apparatus 107, and electrolytic plating apparatus 108 of the process section 110 are film formation apparatuses. As a method for transferring a wafer W between apparatuses in the process section 110, a transfer method by an operator and/or a transfer method by a transfer unit (not shown) are used.

Each of the apparatuses in the process section 110 is connected to and controlled by the process controller 111 having a CPU. The process controller 111 is connected to a keyboard, the user interface 112, and the storage portion 113. The keyboard is used for a process operator to input commands for operating the apparatuses in the process section 110. The user interface 112 includes a display or the like used for showing visualized images of the operational status of the apparatuses in the process section 110. The storage portion 113 stores recipes with control programs and process condition data recorded therein, for realizing various processes performed in the process section 110 under the control of the process controller 111.

A required recipe is retrieved from the storage portion 113 and executed by the process controller 111 in accordance with an instruction or the like input through the user interface 112. Consequently, each of various predetermined processes is performed in the process section 110 under the control of the process controller 111. Recipes may be stored in a readable storage medium, such as a CD-ROM, hard disk, flexible disk, or nonvolatile memory. Further, recipes may be utilized on-line, while it is transmitted among the respective apparatuses in the process section 110, or transmitted from an external apparatus through, e.g., a dedicated line, as needed.

Each of the apparatuses in the process section 110 may be provided with and controlled by its own control section including a process controller, a user interface, and a storage portion. This arrangement can be adopted in place of the global control by the main control section 120, or along with the global control by the main control section 120, The SOD apparatus 101 is used to apply a chemical solution onto a wafer W to form an inter-level insulating film formed of, e.g., a Low-k film, or an etching stopper film by a spin coating method. The SOD apparatus 101 includes a spin coater unit and a heat processing unit to perform a heat process on a wafer W with a coating film formed thereon (although the structure thereof is not shown in detail). In the case of a wafer processing system, a CVD apparatus may be used to form an insulating film on a wafer W by a chemical vapor deposition (CVD) method, in place of the SOD apparatus 101.

The resist coating/development apparatus 102 is used to form a resist film used as an etching mask, and an anti-reflective coating. The resist coating/development apparatus 102 includes a resist coating unit, a developing unit, and thermal processing units (although the structure thereof is not shown in detail). The resist coating unit is arranged to apply a resist liquid onto a wafer W to form a resist film by spin coating. The developing unit is arranged to perform a development process on a resist film which has been subjected to light exposure with a predetermined pattern in the light exposure apparatus 103. The thermal processing units are arranged to respectively perform thermal processes on a wafer W with a resist film formed thereon, a wafer W treated by a light exposure process, and a wafer W treated by a development process.

The light exposure apparatus 103 is used to subject a wafer W with a resist film formed thereon to light exposure with a predetermined circuit pattern. The cleaning apparatus 104 is arranged to perform a cleaning process using purified water or a chemical solution, a denaturing process of polymer residues etc. remaining after an etching process, and a recovery process of an inter-level insulating film for damage due to etching, as described later in detail. The ashing apparatus 105 is arranged to perform an ashing process of a resist film, by use of, e.g., plasma.

The etching apparatus 106 is arranged to perform an etching process on an inter-level insulating film or the like formed on a wafer W, and a recovery process of an inter-level insulating film for damage due to etching. The etching process may be of a type using plasma or a type using a chemical solution. An etching using plasma will be described later, with reference to FIG. 6. The sputtering apparatus 107 is used to form, e.g., each of an anti-diffusion film and a Cu seed layer. The electrolytic plating apparatus 108 is arranged to embed Cu in an interconnection groove having a Cu seed layer formed therein. The CMP apparatus 109 is arranged to perform a planarization process on a surface of an interconnection groove filled with Cu and so forth.

Figure 2:
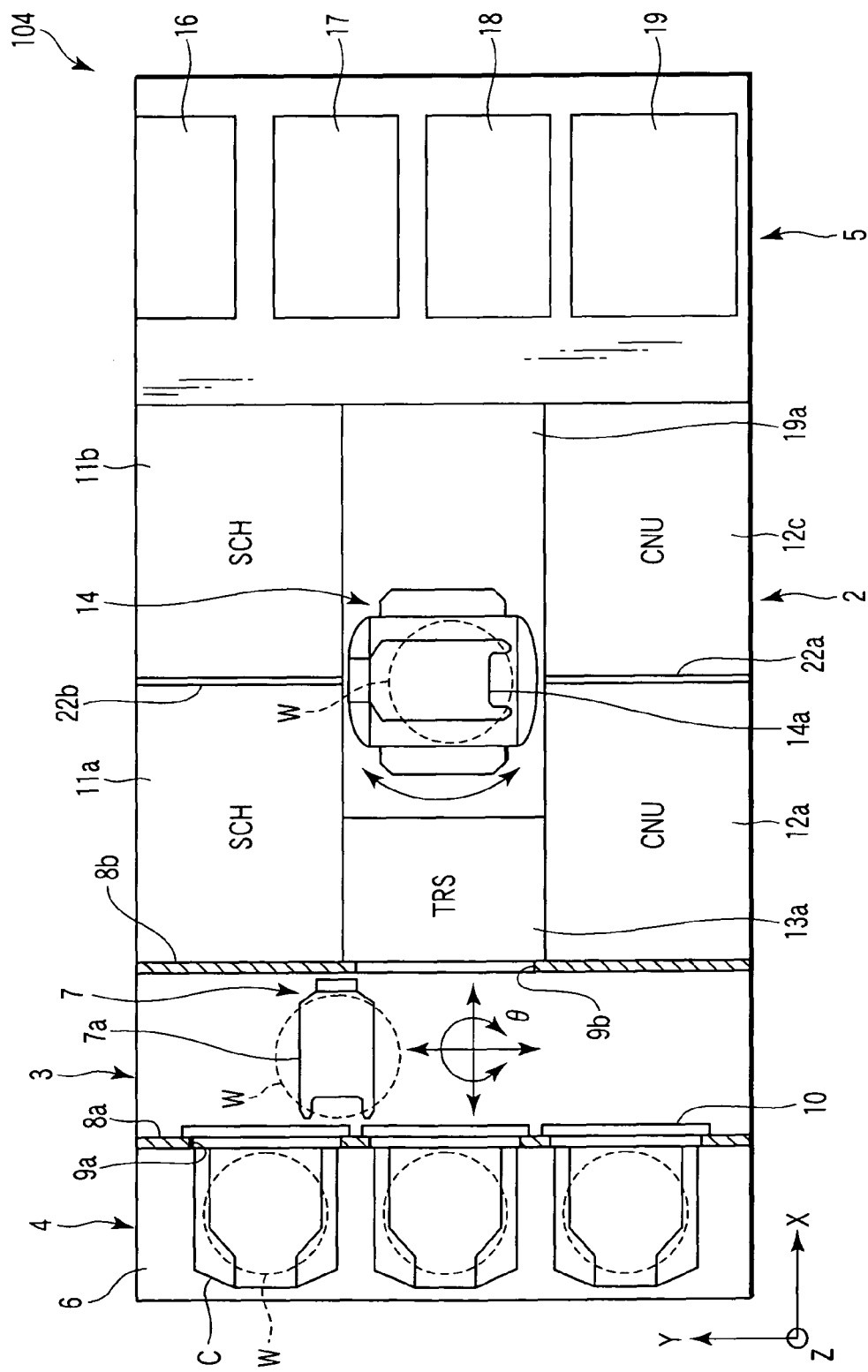
FIG. 2 is a plan view schematically showing the structure of a cleaning apparatus.
Figure 3:
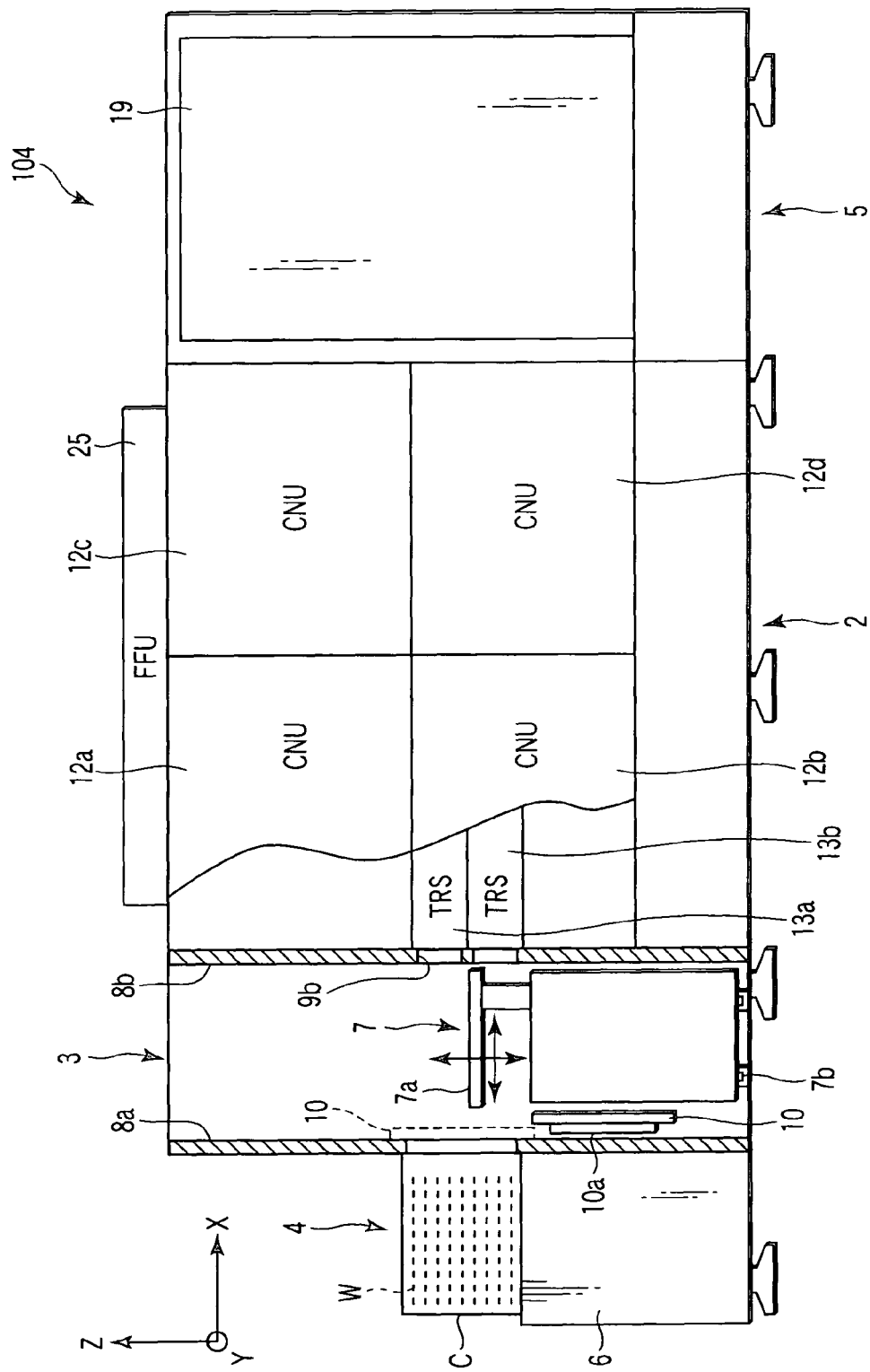
FIG. 3 is a front view schematically showing the structure of the cleaning apparatus.
Figure 4:
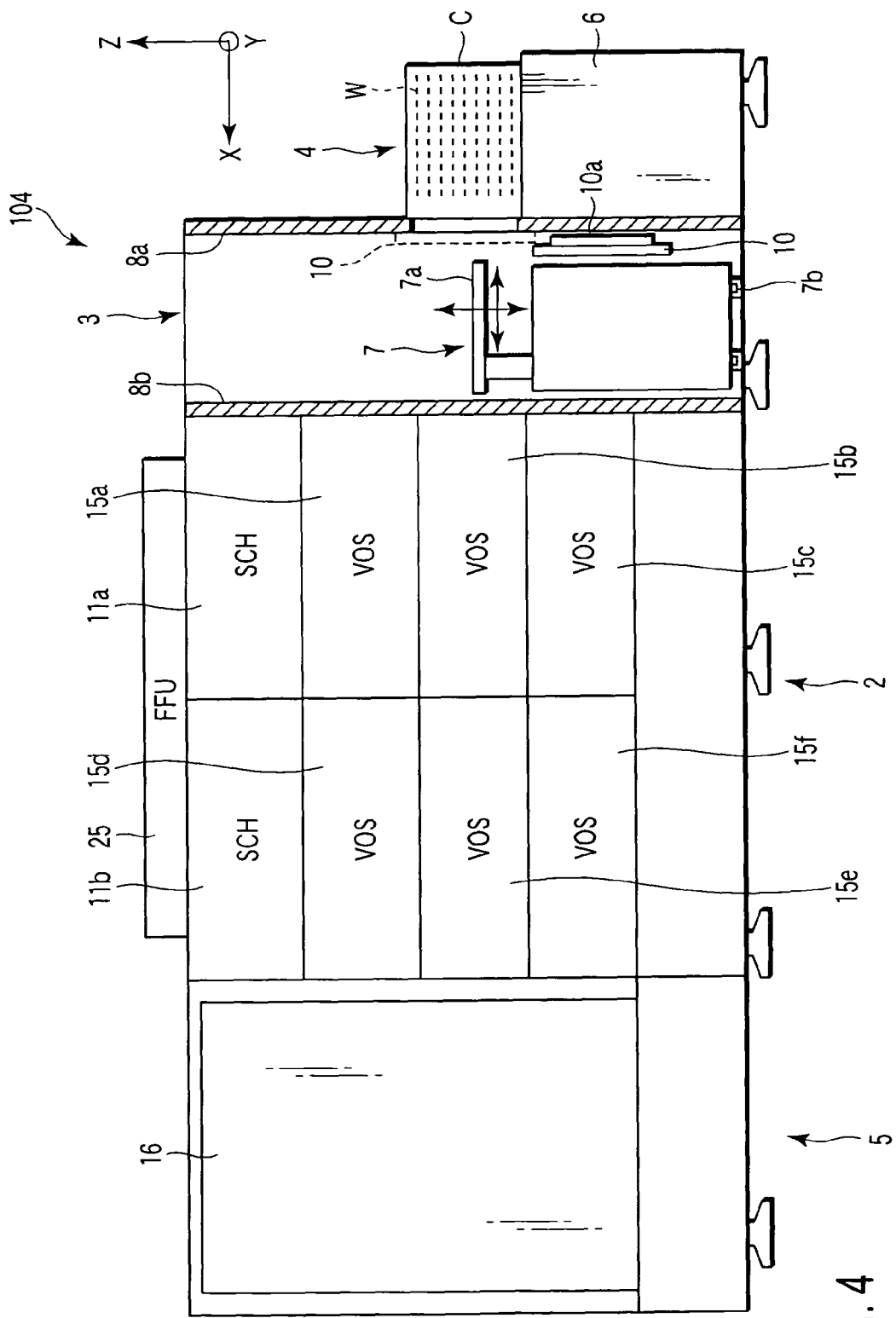
FIG. 4 is a back view schematically showing the structure of the cleaning apparatus.

Next, a detailed explanation will be given of the cleaning apparatus 104. FIGS. 2, 3, and 4 are a plan view, a front view, and a back view, respectively, schematically showing the cleaning apparatus 104. The cleaning apparatus 104 includes a carrier station 4. The carrier station 4 is arranged such that carriers each storing wafers W are sequentially transferred from other processing apparatuses onto the carrier station 4. The carrier station 4 is also arranged such that carriers each storing wafers W processed in the cleaning apparatus 104 are transferred from the carrier station 4 to processing apparatuses for subsequent processes. The cleaning apparatus 104 further includes a process station 2. The process station 2 includes a plurality of process units arranged to respectively perform a cleaning process, a denaturing process, and a recovery process. A transfer station 3 is arranged to transfer a wafer W between the process station 2 and carrier station 4. A chemical station 5 is arranged to perform manufacture, preparation, and storage of a chemical solution, purified water, gas, and so forth to be used in the process station 2.

Each carrier C contains therein wafers W essentially in a horizontal state at regular intervals in the vertical direction (Z-direction). The wafers W are transferred to and from the carrier C through one side of the carrier C, which is opened/closed by a lid 10a (which is not shown in FIG. 2, but shown in FIGS. 3 and 4 in a detached state).

As shown in FIG. 2, the carrier station 4 has a table 6 on which carriers C can be placed at three positions arrayed in a Y-direction defined in FIG. 2. Each carrier C is placed on the table 6 such that the side provided with the lid 10a faces a partition wall 8a between the carrier station 4 and transfer station 3. The partition wall 8a has window portions 9a formed therein at positions corresponding to the mount positions for carriers C. Each of the window portions 9a is provided with a shutter 10 on the transfer station 3 side to open/close the window portion 9a. This shutter 10 includes holding means (not shown) for holding the lid 10a of a carrier C, so that the holding means can hold the lid 10a and withdraw it into the transfer station 3, as shown in FIGS. 3 and 4.

The transfer station 3 is provided with a wafer transfer unit 7 disposed therein, which has a wafer transfer pick 7a for holding a wafer W. The wafer transfer unit 7 is movable in the Y-direction along guides 7b (see FIGS. 3 and 4) extending on the floor of the transfer station 3 in the Y-direction. The wafer transfer pick 7a is slidable in an X-direction, movable up and down in the Z-direction, and rotatable in the X-Y plane (θ rotation).

With the arrangement described above, the shutters 10 can be retreated to allow the interior of the carriers C to communicate with the transfer station 3 through the window portions 9a. In this state, the wafer transfer pick 7a can access any one of the carriers C placed on the table 6. Accordingly, the wafer transfer pick 7a can transfer a wafer W from any height position in each of the carriers C, and can transfer a wafer W onto any height position in each of the carriers C.

The process station 2 includes two wafer mount units (TRS) 13a and 13b on the transfer station 3 side. For example, the wafer mount unit (TRS) 13b is used to place a wafer W when the wafer W is transferred from the transfer station 3 to the process station 2. The wafer mount unit (TRS) 13a is used to place a wafer W when the wafer W is returned to the transfer station 3 after it is subjected to a predetermined process in the process station 2.

The process station 2 is provided with a fan and filter unit (FFU) 25 arranged to send clean air into the process station 2 as a downflow. With this arrangement, a wafer W processed in the process station 2 is prevented from being contaminated where the processed wafer W is placed in the upper wafer mount unit (TRS) 13a.

A partition wall 8b is disposed between the transfer station 3 and process station 2, and has a window portion 9b formed therein at a position corresponding to the wafer mount units (TRS) 13a and 13b. The wafer transfer pick 7a can access the wafer mount units (TRS) 13a and 13b through the window portion 9b to transfer a wafer W between the carriers C and wafer mount units (TRS) 13a and 13b.

On the rear side of the process station 2, there are denaturing units (VOS) 15a to 15f arranged to denature polymer residues etc. remaining after an etching process or ashing process, by molecules of a gas (which will be referred to as "denaturing gas", hereinafter) containing ozone ($O_3$) and water vapor. The term "denature" means that the properties of polymer residues etc. remaining on a wafer W are changed to be soluble in purified water or a chemical solution. Further, the denaturing units (VOS) 15a to 15f can be used to denature a resist film by a denaturing process gas to be soluble in water, in place of ashing and removing of the resist film by an ashing process.

Each of the denaturing units (VOS) 15a to 15f includes a chamber defining a disk-like space for accommodating a wafer W, which is airtight and can be dissembled into upper and lower portions (although the structure thereof is not shown in detail). The chamber is provided with a wafer mount stage disposed therein, which has proximity pins disposed on the surface to support a wafer W in a horizontal state and a heater built therein. The denaturing process gas is caused to flow in an essentially horizontal direction within the disk-like space inside the chamber.

Silylation units (SCH) 11a and 11b are disposed on the denaturing units (VOS) 15a and 15d. Each of the silylation units is arranged to perform a silylation process to recover the damage of damaged portions of an inter-level insulating film, which has been damaged or changed to have a hydrophilic surface by an ashing process, cleaning process, or the like.

Figure 5:
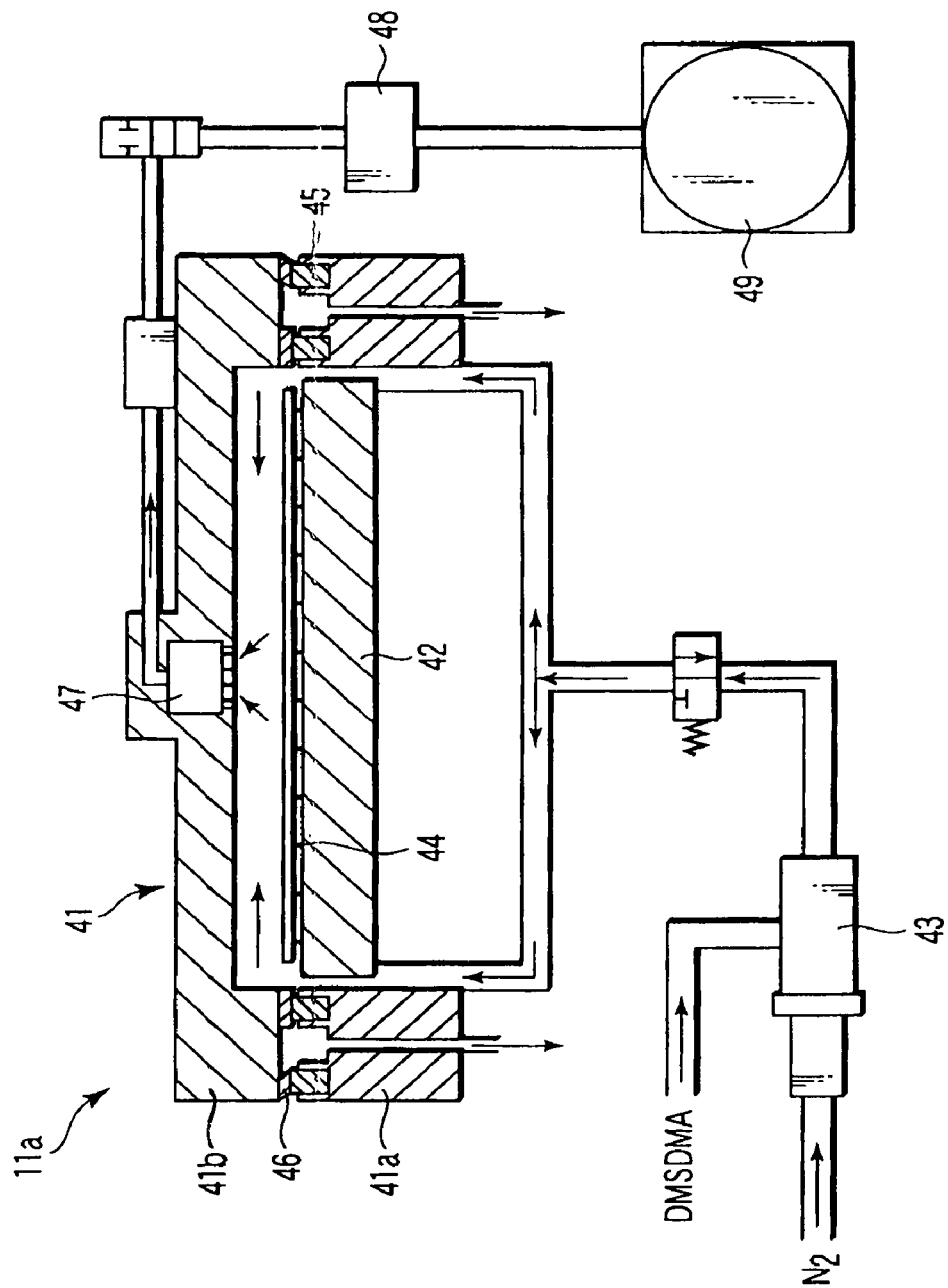
FIG. 5 is a sectional view schematically showing a silylation unit (SCH)

FIG. 5 is a sectional view schematically showing the silylation unit (SCH) 11a. The silylation unit (SCH) 11a includes a chamber 41 for accommodating a wafer W. The chamber 41 is formed of a stationary lower container 41a, and a lid 41b that covers the lower container 41a. The lid 41b is movable up and down by an elevating unit (not shown). The lower container 41a includes a hot plate 42, around which nitrogen gas with vapor of a silylation agent carried therein, such as DMSDMA (Dimethylsilyldimethylamine), is supplied into the chamber 41.

In the structure shown in FIG. 5, liquid DMSDMA is vaporized by a vaporizer 43, and is then carried by $N_2$ gas. Alternatively, vaporized DMSDMA gas (i.e., DMSDMA vapor) may solely be supplied into the chamber 41. As described later, when DMSDMA is supplied into the chamber 41, the interior of the chamber 41 is maintained at a predetermined vacuum level. Accordingly, utilizing the pressure difference between the vaporizer 43 and chamber 41, DMSDMA gas is easily supplied into the chamber 41.

The hot plate 42 is adjustable in temperature within a range of, e.g., 50 to 200° C. The hot plate 42 is provided with pins 44 on the surface to support a wafer W. Where a wafer W is not mounted directly on the hot plate 42, the wafer W is prevented from being contaminated on its bottom surface. The lower container 41a is provided with a first seal ring 45 disposed on the top face of the peripheral portion. The lid 41b is provided with a second seal ring 46 disposed on the bottom face of the peripheral portion. When the lid 41b is pressed against the lower container 41a, the second seal ring 46 comes into contact with the first seal ring 45. The space defined between the first and second seal rings 45 and 46 can be pressure-reduced. When the pressure of this space is reduced, it is ensured that the chamber 41 is airtight. The lid 41b has an exhaust port 47 essentially at the center for exhausting nitrogen gas with DMSDMA carried therein supplied into the chamber 41. The exhaust port 47 is connected to a vacuum pump 49 through a pressure adjusting unit 48.

On the front side of the process station 2, there are cleaning units (CNU) 12a to 12d arranged to perform a chemical solution process or water washing process on a wafer W treated by the denaturing units (VOS) 15a to 15f, so as to remove denatured polymer residues etc.

Each of the cleaning units (CNU) 12a to 12d (although the structure thereof is not shown in detail) includes a rotatable spin chuck arranged to hold a wafer W essentially in a horizontal state, and a cup surrounding the spin chuck. A chemical solution nozzle is disposed to supply a predetermined chemical solution onto the surface of a wafer W held by the spin chuck. A cleaning nozzle is disposed to mix nitrogen gas into purified water and utilize the pressure of this nitrogen gas to deliver purified water mist onto the surface of a wafer W held by the spin chuck. A rinsing nozzle is disposed to supply purified water onto a wafer W to perform a water washing process (rinsing process) thereon, after the wafer W is treated by the chemical solution process. Further, a gas spray nozzle is disposed to spray drying gas toward a wafer W, after the wafer W is treated by the water washing process.

Each of the cleaning units (CNU) 12a to 12d may be provided with a nozzle arranged to supply onto a wafer W a chemical solution, such as diluted hydrofluoric acid, for removing a silicon oxide film or silicon oxynitride film, and/or a nozzle arranged to supply onto a wafer W a peeling solution for performing a peeling process of a resist film used as an etching mask.

The denaturing units (VOS) 15a to 15c and denaturing units (VOS) 15d to 15f described above have structures essentially symmetric with respect to a partition wall 22b. The silylation unit (SCH) 11a and silylation unit (SCH) 11b have structures essentially symmetric with respect to the partition wall 22b. Similarly, the cleaning units (CNU) 12a and 12b and cleaning units (CNU) 12c and 12d have structures essentially symmetric with respect to the partition wall 22a.

A main wafer transfer unit 14 is disposed essentially at the center of the process station 2, and is arranged to transfer a wafer W within the process station 2. The main wafer transfer unit 14 has a wafer transfer arm 14a for transferring a wafer W. The main wafer transfer unit 14 is rotatable about a Z-axis. Further, the wafer transfer arm 14a is movable back and forth in a horizontal direction, and movable up and down in the Z-direction. With this arrangement, the main wafer transfer unit 14 can access the respective units disposed in the process station 2 to transfer a wafer W between the units, without moving itself in the X-direction.

The chemical station 5 includes a chemical solution storage portion 16 that stores various chemical solutions to be used in various processing units disposed in the process station 2. A liquid supply portion 17 including a plurality of pumps and switching valves is disposed to supply various chemical solutions stored in the chemical solution storage portion 16 to predetermined processing units. A purified water supply portion 18 is disposed to supply purified water to the cleaning units (CNU) 12a to 12d. A gas supply portion 19 is disposed to supply predetermined gases to various processing units.

Figure 6:
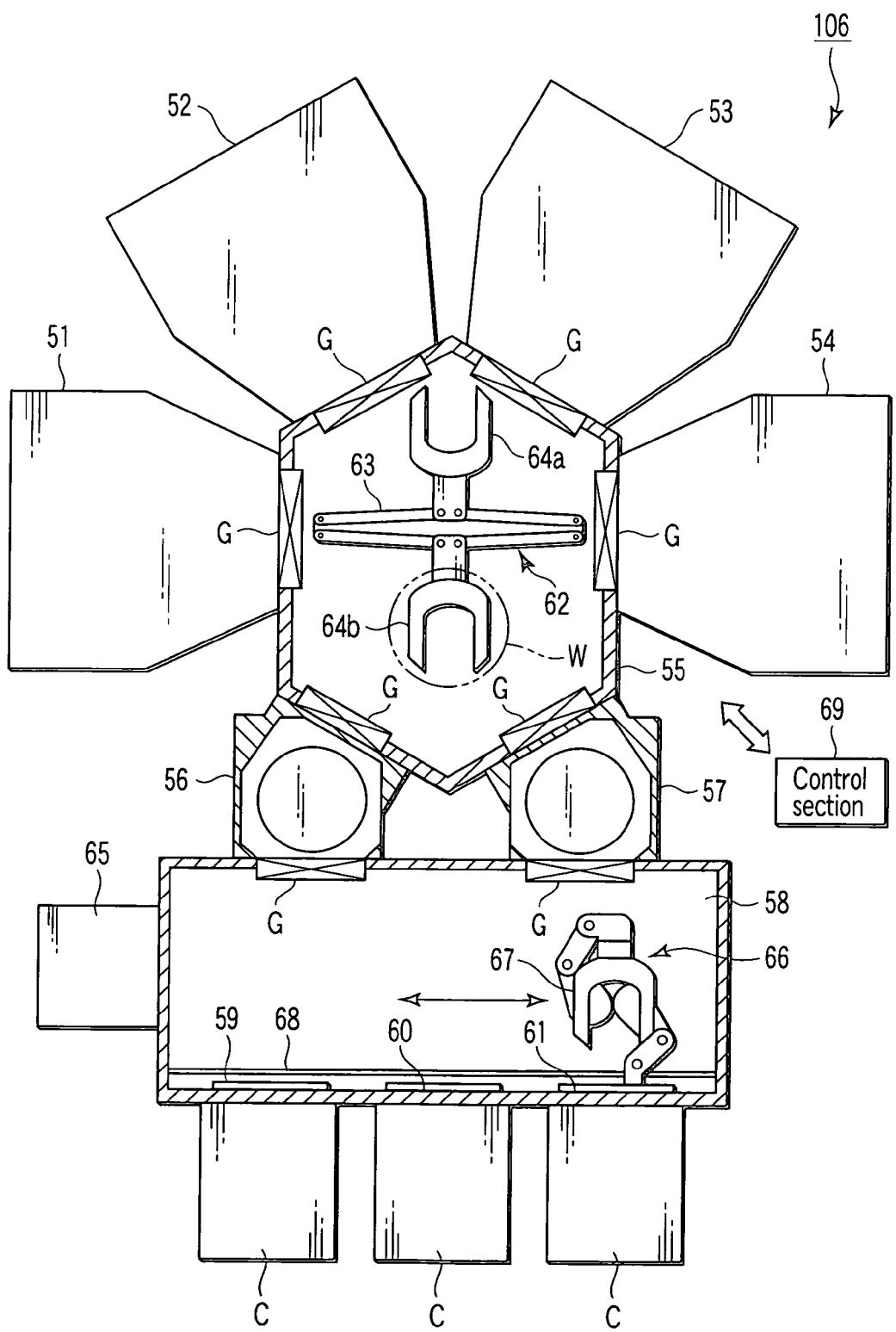
FIG. 6 is a plan view schematically showing the structure of an etching apparatus.

Next, an explanation will be given of the structure of the etching apparatus 106. FIG. 6 is a plan view schematically showing the structure of the etching apparatus 106. The etching apparatus 106 includes etching units 51 and 52 for performing a plasma etching process, and silylation units (SCH) 53 and 54. These units 51 to 54 are disposed to respectively correspond to four sides of a hexagonal wafer transfer chamber 55. The other two sides of the wafer transfer chamber 55 are respectively connected to load-lock chambers 56 and 57. A wafer I/O chamber 58 is connected to the load-lock chambers 56 and 57 on the side opposite to the wafer transfer chamber 55. The wafer I/O chamber 58 has three ports 59, 60, and 61 on the side opposite to the load-lock chambers 56 and 57, wherein the ports are used for respectively connecting three carriers C that can contain wafers W.

The etching units 51 and 52, silylation units (SCH) 53 and 54, and load-lock chambers 56 and 57 are connected to the sides of the wafer transfer chamber 55 respectively through gate valves G, as shown in FIG. 6. Each of these units and chambers communicates with the wafer transfer chamber 55 when the corresponding gate valve G is opened, and is blocked from the wafer transfer chamber 55 when the corresponding gate valve G is closed. Gate valves G are also disposed between the load-lock chambers 56 and 57 and the wafer I/O chamber 58. Each of the load-lock chambers 56 and 57 communicates with the wafer I/O chamber 58 when the corresponding gate valve G is opened, and is blocked from the wafer I/O chamber 58 when the corresponding gate valve G is closed.

The wafer transfer chamber 55 is provided with a wafer transfer unit 62 disposed therein, for transferring wafers W to and from the etching units 51 and 52, silylation units (SCH) 53 and 54, and load-lock chambers 56 and 57. The wafer transfer unit 62 is disposed essentially at the center of the wafer transfer chamber 55. The wafer transfer unit 62 includes two rotation/stretch portions 63, which are rotatable and extensible/contractible. Two blades 64a and 64b, each for supporting a wafer W, are respectively connected to the distal ends of the rotation/stretch portions 63. The two blades 64a and 64b are connected to the rotation/stretch portions 63 to face opposite directions. The interior of the wafer transfer chamber 55 can be maintained at a predetermined vacuum level.

The wafer I/O chamber 58 is provided with a HEPA filter (not shown) disposed on the ceiling. Clean air is supplied through the HEPA filter into the wafer I/O chamber 58 in a downflow state. A wafer W is transferred to and from the wafer I/O chamber 58 within a clean air atmosphere at atmospheric pressure. Each of the three ports 59, 60, and 61 of the wafer I/O chamber 58 for connecting a carrier C is provided with a shutter (not shown). A carrier C, which contains wafers W or is empty, is directly connected to each of the ports 59, 60, and 61. The shutter is then opened for the carrier C to communicate with the wafer I/O chamber 58 while preventing inflow of outside air. An alignment chamber 65 for performing alignment of a wafer W is disposed on one side of the wafer I/O chamber 58.

The wafer I/O chamber 58 is provided with a wafer transfer unit 66 disposed therein, for transferring wafers W to and from the carriers C and load-lock chambers 56 and 57. The wafer transfer unit 66 includes articulated arm structures respectively having hands 67 at the distal ends. The wafer transfer unit 66 is movable on a rail 68 in a direction in which the carriers C are arrayed, to transfer a wafer W placed on each of the hands 67. A control section 69 is arranged to control the operation of the wafer transfer units 62 and 66 and the entire system.

The silylation units (SCH) 53 and 54 have almost the same structure as that of the silylation units (SCH) 11a and 11b. Accordingly, the structure of the silylation units (SCH) 53 and 54 is not shown in detail. However, the silylation units (SCH) 53 and 54 is arranged to further supply nitrogen gas containing water vapor at a predetermined concentration (or water vapor only) into the chamber 41.

When an inter-level insulating film, which has been damaged or changed to have a hydrophilic surface by an etching process or ashing process, is taken out into the atmosphere (air), moisture is adsorbed thereon and increases the dielectric constant. Accordingly, after a wafer W is subjected to an etching process within the etching apparatus 106, the wafer W is subsequently subjected to a silylation process within the etching apparatus 106, without exposing the wafer W to the atmosphere (air). With this arrangement, the dielectric constant is prevented from being increased due to moisture adsorption.

In the etching apparatus 106, a wafer W treated by an etching process in the etching units 51 and 52 is transferred to the silylation units (SCH) 53 and 54 in a vacuum atmosphere. In this case, portions damaged by etching scarcely absorb moisture, and thus may suffer a difficulty in causing a silylation reaction.

In light of this, the silylation units (SCH) 53 and 54 are arranged to supply water vapor into the chamber 41. This arrangement allows damaged portions to moderately cause a reaction for absorbing moisture, which facilitates the silylation reaction. As described previously, however, if the reaction for absorbing moisture is excessively caused, this may adversely inhibit the silylation reaction. Accordingly, it is necessary to control the supply of water vapor to prevent such reaction inhibition.

Figure 7:
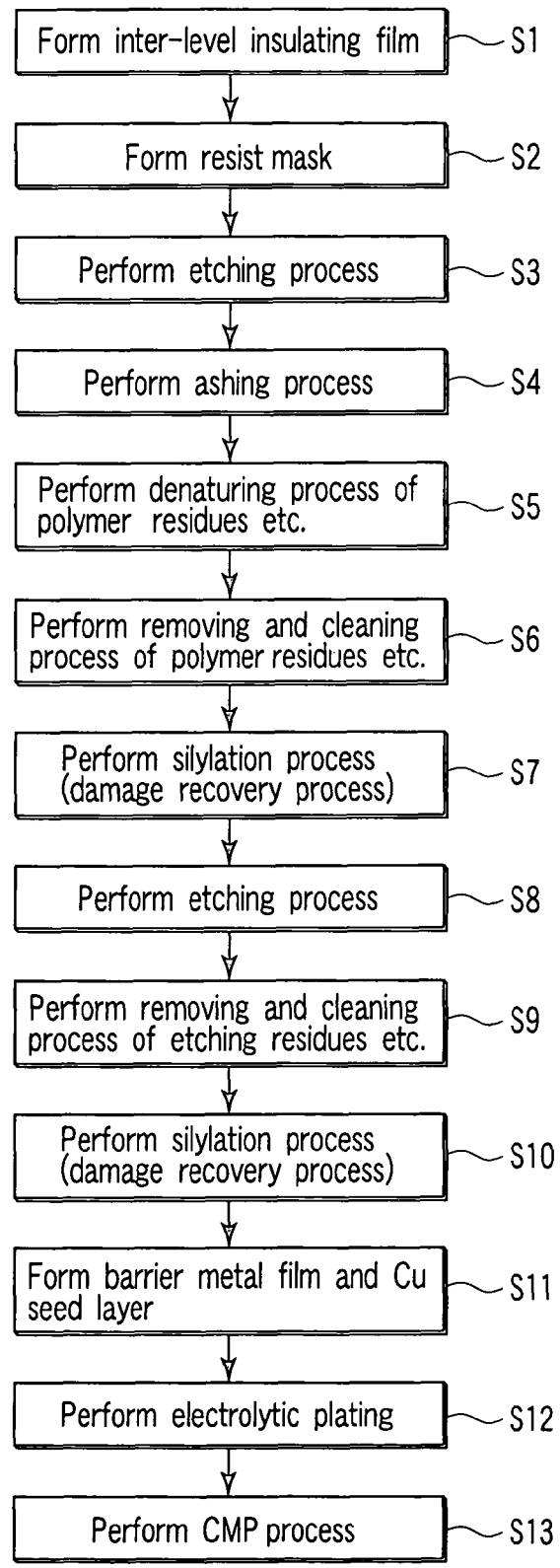
FIG. 7 is a flowchart showing a process for forming an interconnection structure by use of a single damascene method.
Figure 8:
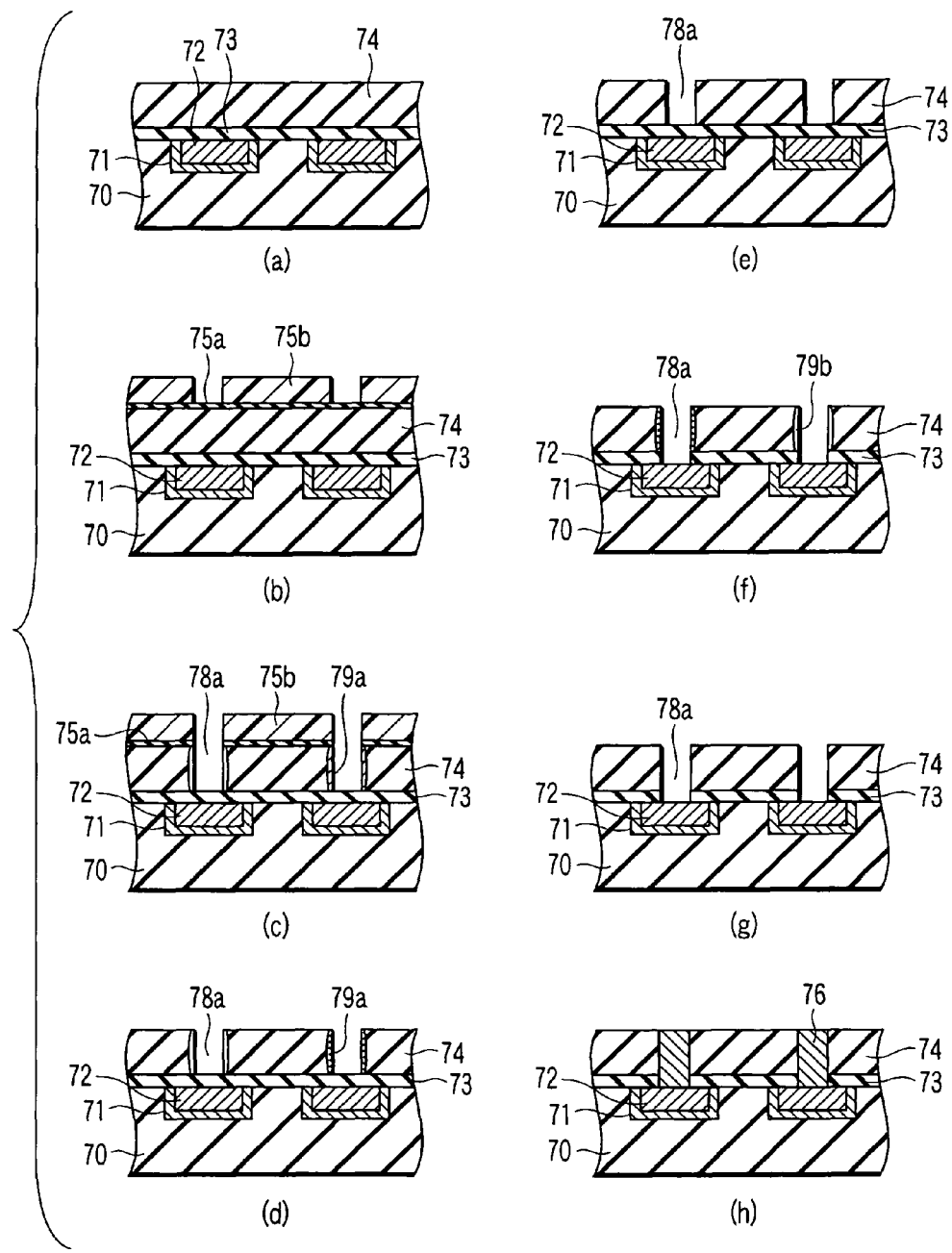
FIG. 8 comprises sectional views showing sequentially ordered steps of the process shown in FIG. 7.

Next, an explanation will be given of a method for forming an interconnection groove in an inter-level insulating film disposed on the wafer W, performed by the wafer processing system. FIG. 7 is a flowchart showing a process for forming an interconnection structure by use of a single damascene method. FIG. 8 comprises sectional views showing sequentially ordered steps of the process shown in FIG. 7.

At first, the following structure is prepared on a wafer W (the wafer W itself is not shown). Specifically, an insulating film 70 is disposed on the wafer W, in which a lower interconnection line (copper interconnection line) 72 is embedded with a barrier metal film 71 interposed therebetween, and a stopper film 73, such as an SiN film or SiC film, is disposed on the insulating film 70. The wafer W thus prepared is transferred into the SOD apparatus 101, in which an inter-level insulating film 74, such as a Low-k film, is formed on the stopper film 73 (Step S1 and FIG. 8, (a)).

Then, the wafer W with the inter-level insulating film 74 formed thereon is transferred into the resist coating/development apparatus 102, in which an anti-reflective coating 75a and a resist film 75b are sequentially formed on the inter-level insulating film 74. Then, the wafer W is transferred into the light exposure apparatus 103, in which the wafer W is subjected to a light exposure process with a predetermined pattern. Then, the wafer W is transferred back into the resist coating/development apparatus 102, in which the resist film 75b is subjected to a development process performed by the developing unit to form a predetermined circuit pattern on the resist film 75b (Step S2 and FIG. 8, (b)).

Then, the wafer W is transferred into the etching apparatus 106, in which an etching process is performed on the wafer W (Step S3). Consequently, a via-hole 78a reaching the stopper film 73 is formed in the inter-level insulating film 74 (FIG. 8, (c)). In FIG. 8, (c), a reference symbol 79a denotes a damaged portion, which will be explained in detail. The wafer W thus treated by the etching process is transferred into the ashing apparatus 105, in which an ashing process is performed to ash the anti-reflective coating 75a and resist film 75b (Step S4).

The wafer W thus treated by the ashing process is transferred into the cleaning apparatus 104, in which the wafer W is processed by one of the denaturing units (VOS) 15a to 15f. In this process, polymer residues etc. remaining on the wafer W treated by the etching process and ashing process are denatured to be soluble in water (Step S5). If the denaturing units (VOS) 15a to 15f can be used to perform a process for denaturing the anti-reflective coating 75a and resist film 75b, this denaturing process may be used in place of the ashing process. The wafer W treated by the denaturing process is transferred into one of the cleaning units (CNU) 12a to 12d, in which a process is performed to remove the denatured polymer residues etc. (Step S6 and FIG. 8, (d)).

When the etching process, ashing process, and/or subsequent water washing process are performed as described above, the sidewall of the via-hole 78a formed in the inter-level insulating film 74 is damaged. Specifically, the damaged portions react with moisture, so the number of methyl groups is decreased and the number of hydroxyl groups is increased near the sidewall of the via-hole 78a, which increases the dielectric constant. If the via-hole 78a with the damaged portions 79a formed in the sidewall is filled with a metal material to form an interconnection line, the parasitic capacitance between interconnection lines is increased, so a signal delay occurs and the insulation between interconnection lines is deteriorated. Although FIG. 8, (c) and (d), schematically shows the damaged portions 79a, the boundary between a damaged portion 79a and non-damaged portion is not clear, unlike in the drawings.

Accordingly, in order to recover the damage of the damaged portions 79a of the inter-level insulating film 74, the wafer W is transferred into one of the silylation units (SCH) 11a and 11b, in which a silylation process is performed for the damaged portions (Step S7 and FIG. 8, (e)). The conditions of the silylation process are suitably selected in accordance with the type of the silylation agent, as follows. For example, the temperature of the vaporizer 43 is set to be from a room temperature to 50° C. The silylation agent flow rate is set to be 0.1 to 1.0 g/min. The N₂ gas (purge gas) flow rate is set to be 1 to 10 L/min. The process pressure is set to be 666 to 95,976 Pa (5 to 720 Torr). The temperature of the hot plate 42 is set to be from a room temperature to 200° C. Where DMSDMA is used as the silylation agent, the following method may be used, for example. Specifically, the hot plate 42 is set at 100° C., and the internal pressure of the chamber 41 is decreased to 5 Torr (=666 Pa). Then, DMSDMA vapor carried by nitrogen gas is supplied into the chamber 41 until the internal pressure reaches 55 Torr. Then, the process is performed for, e.g., three minutes, while maintaining the pressure. The silylation reaction using DMSDMA is expressed by the following reaction formula 1.

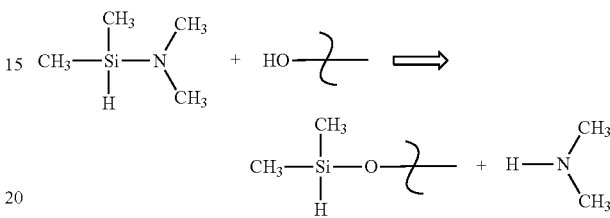

The wafer W thus treated by the silylation process is transferred into the etching apparatus 106, in which an etching process is performed to remove the stopper film 73 (Step S8 and FIG. 8, (f)). Then, the wafer W is transferred into the cleaning apparatus 104, in which a cleaning process is performed by one of the cleaning units (CNU) 12a to 12d (Step S9). When the etching process and/or cleaning process are performed, the sidewall of the via-hole 78a formed in the inter-level insulating film 74 is damaged, so damaged portions 79b are formed. Accordingly, in order to recover the damage of the damaged portions 79b, the wafer W is transferred into one of the silylation units (SCH) 11a and 11b, in which a silylation process is performed thereon (Step S10 and FIG. 8, (g)).

Thereafter, the wafer W is transferred into the sputtering apparatus 107, in which a barrier metal film and a Cu seed layer (i.e., plating seed layer) are formed on the inner surface of the via-hole 78a (Step S11). Then, the wafer W is transferred into the electrolytic plating apparatus 108, in which a metal 76, such as copper, is embedded in the via-hole 78a by electrolytic plating (Step S12). Then, the wafer W is subjected to a heat process to perform an annealing process of the metal 76 embedded in the via-hole 78a (no annealing apparatus is shown in FIG. 1). Then, the wafer W is transferred into the CMP apparatus 109, in which a planarization process is performed on the wafer W by a CMP method (Step S13 and FIG. 8, (h)).

As described above, according to a method for forming an interconnection groove, the sidewall of the via-hole 78a formed in the inter-level insulating film 74 is damaged by etching, ashing, and/or cleaning, but a silylation process is performed for damaged portions to recovery the damage. Consequently, it is possible to provide a groove interconnection with excellent electrical characteristics, and to thereby improve the reliability of a semiconductor device.

In the explanation given above, a silylation process is performed after the process performed by the cleaning units (CNU) 12a to 12d is finished. However, where the inter-level insulating film 74 is damaged or may be damaged by a predetermined process, this process may be followed by a silylation process. For example, a silylation process is preferably performed by the silylation units (SCH) 53 and 54 disposed in the etching apparatus 106 immediately after the etching process of Step S3 or S8, in place of or in addition to the process performed by the cleaning units (CNU) 12a to 12d. Further, a silylation process is preferably performed by the silylation units (SCH) 11*a* and 11*b* disposed in the cleaning apparatus 104 immediately after the ashing process of Step S4.

Figure 9A:
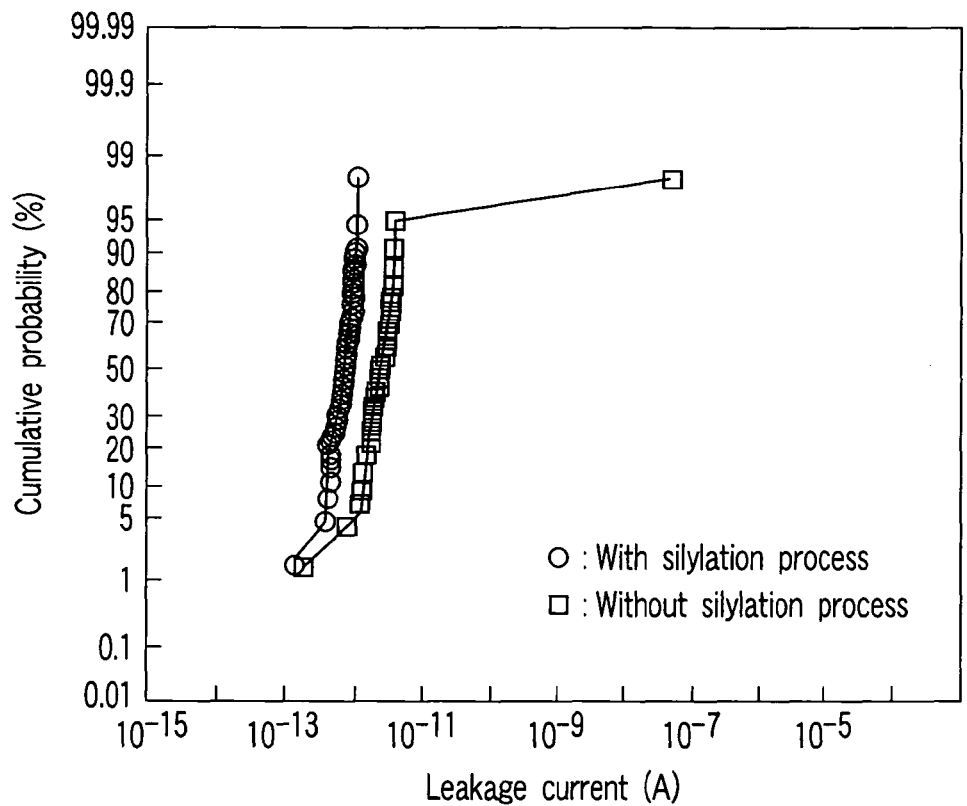
FIG. 9A is a graph showing how the relationship between leakage current and cumulative probability differs depending on the presence and absence of a silylation process.
Figure 9B:
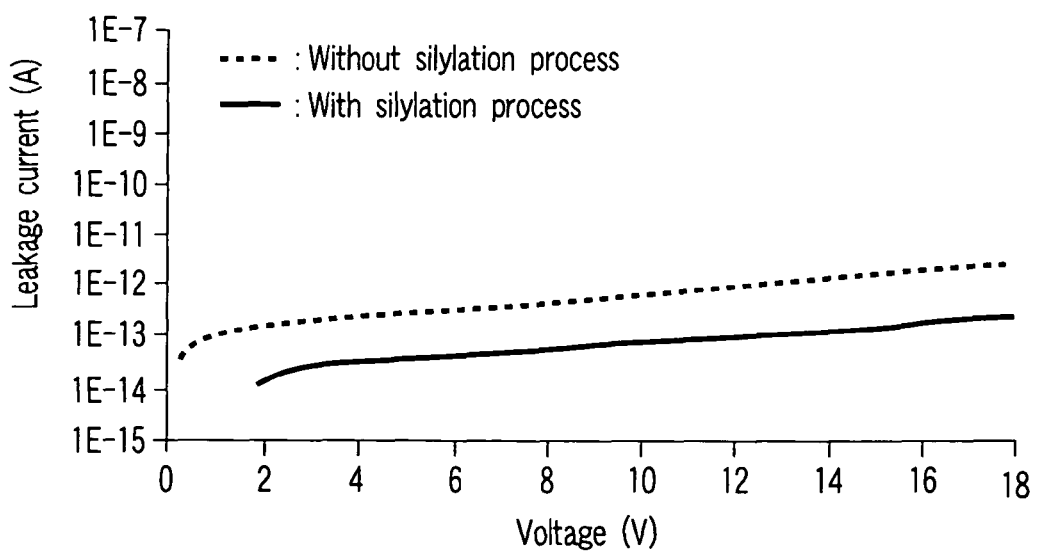
FIG. 9B is a graph showing how the relationship between voltage and leakage current differs depending on the presence and absence of a silylation process.

FIG. 9A is a graph showing how the relationship between leakage current and cumulative probability differs depending on the presence and absence of a silylation process. FIG. 9B is a graph showing how the relationship between voltage and leakage current differs depending on the presence and absence of a silylation process. In other words, these graphs show a difference between the presence and absence of a silylation process after the process of the cleaning units (CNU) 12*a* to 12*d*. The test sample that rendered the results shown in FIGS. 9A and 9B had the same structure as that shown in FIG. 8, (*h*), wherein the inter-level insulating film 74 was formed of a low-k film selected from LKD (trade name) series of JSR Co. Ltd. As shown in FIGS. 9A and 9B, where the silylation process was performed, the leakage current was decreased and the breakdown voltage was improved, i.e., the insulation property of the inter-level insulating film was improved, as compared to the example performed without the silylation process. Further, the dielectric constant of the inter-level insulating film thus processed was additionally measured. As a result, it was confirmed that the example performed with the silylation process rendered an improvement of 10 to 20%, as compared to the example performed without the silylation process.

Figure 10:
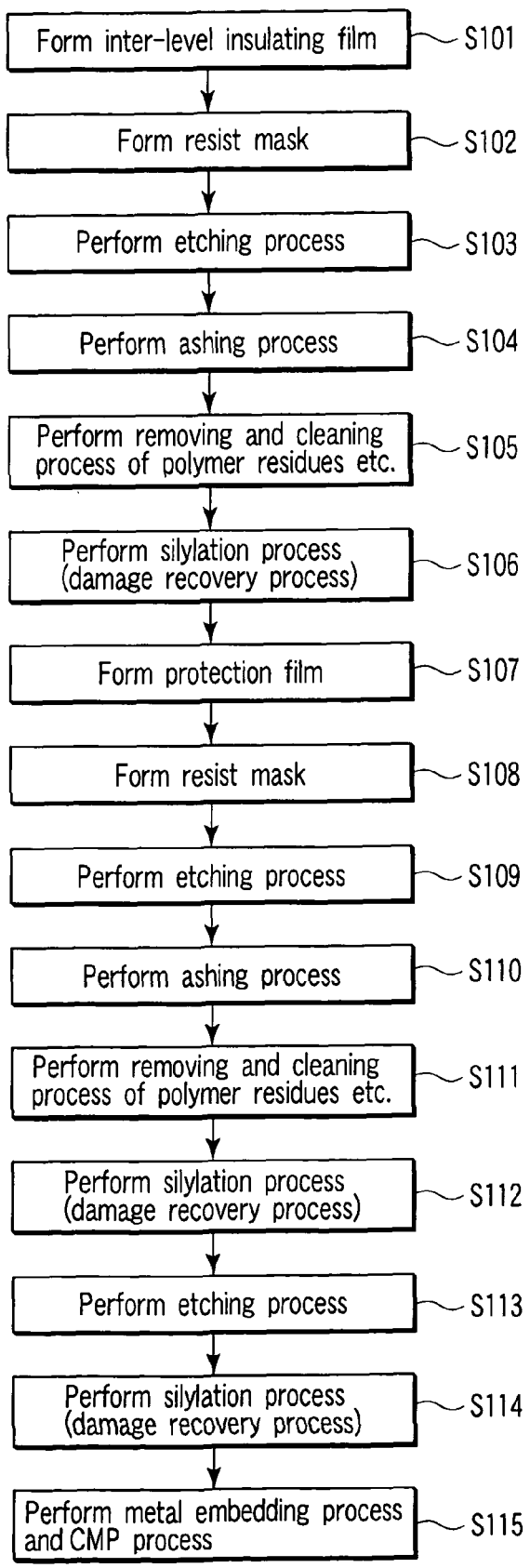
FIG. 10 is a flowchart showing a process for forming an interconnection structure by use of a dual damascene method.
Figure 11:
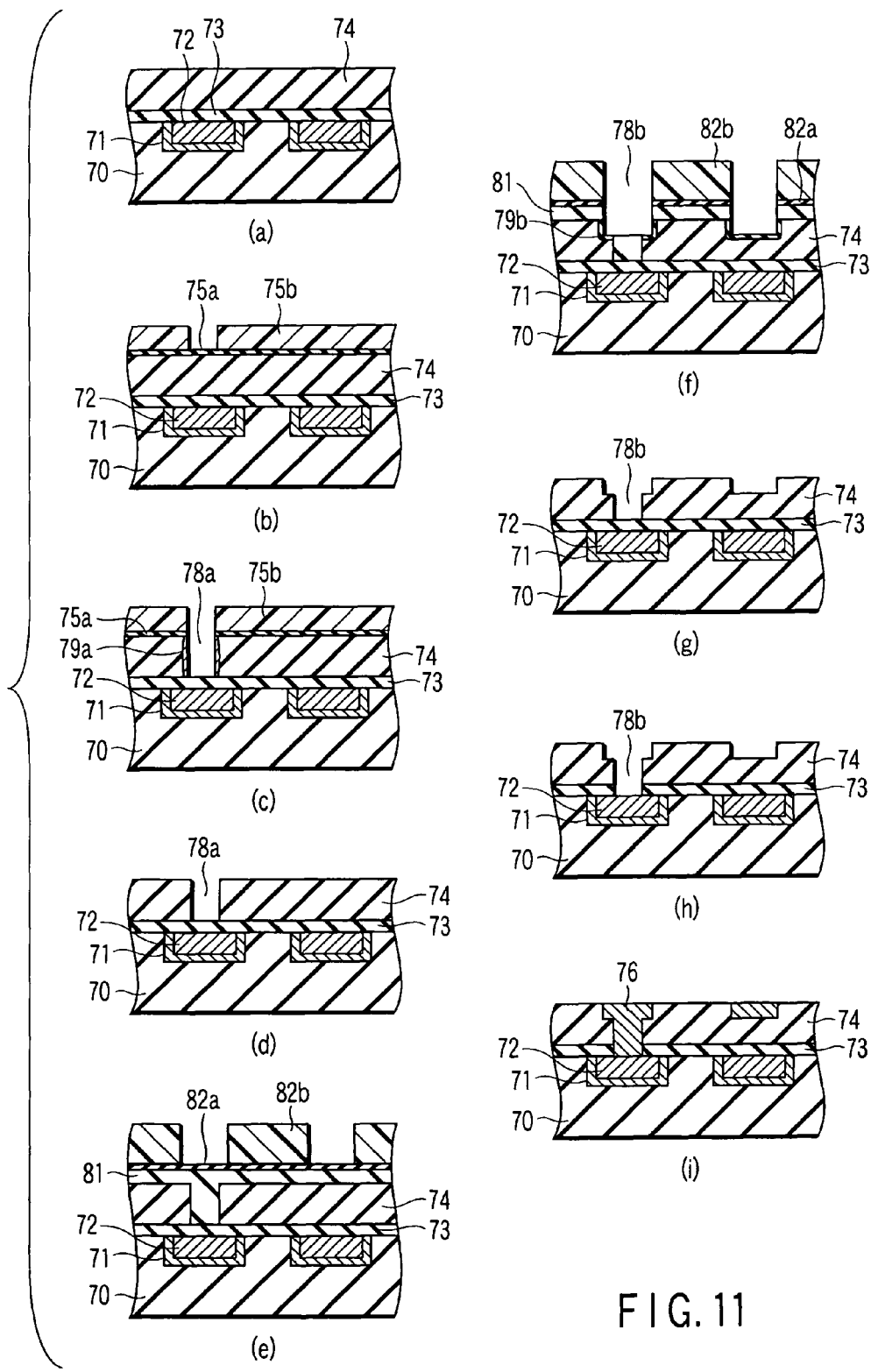
FIG. 11 comprises sectional views showing sequentially ordered steps of the process shown in FIG. 10.

FIG. 10 is a flowchart showing a process for forming an interconnection structure by use of a dual damascene method. FIG. 11 comprises sectional views showing sequentially ordered steps of the process shown in FIG. 10. For this process, the apparatuses used in the respective steps will not be explained, because they have been clarified by the preceding explanation.

At first, the following structure is prepared on a wafer W (the wafer W itself is not shown). Specifically, an insulating film 70 is disposed on the wafer W, in which a lower interconnection line (copper interconnection line) 72 is embedded with a barrier metal film 71 interposed therebetween, and a stopper film 73, such as an SiN film or SiC film, is disposed on the insulating film 70. The wafer W thus prepared is then provided with an inter-level insulating film 74, such as a Low-k film, formed on the stopper film 73 (Step S101 and FIG. 11, (*a*)).

Then, an anti-reflective coating 75*a* and a resist film 75*b* are sequentially formed on the inter-level insulating film 74. Then, the resist film 75*b* is subjected to a light exposure process with a predetermined pattern, and then to a development process to form an etching pattern on the resist film 75*b* (Step S102 and FIG. 11, (*b*)). Then, an etching process using the resist film 75*b* as an etching mask is performed to form a via-hole 78*a* reaching the stopper film 73 (Step S103 and FIG. 11, (*c*)). In FIG. 11, (*c*), a reference symbol 79*a* denotes a damaged portion generated by the etching process. Then, an ashing process is performed to remove the resist film 75*b* and anti-reflective coating 75*a* (Step S104). Then, a cleaning process is performed to remove polymer residues etc. generated by the preceding etching process and/or ashing process (Step S105). Further, a silylation process is performed to recover the damage of the damaged portion 79*a* of the inter-level insulating film 74 (Step S106 and FIG. 11, (*d*)). A silylation process may be performed after the etching of Step S103 and/or the ashing of Step S104.

Then, a protection film 81 is formed on the surface of the inter-level insulating film 74 (Step S107). Then, an anti-reflective coating 82*a* and a resist film 82*b* are sequentially formed on the protection film 81. Then, the resist film 82*b* is subjected to a light exposure process with a predetermined pattern, and then to a development process to form a circuit pattern on the resist film 82*b* (Step S108 and FIG. 11, (*e*)). The protection film 81 can be formed from a predetermined chemical solution applied by spin coating in the SOD apparatus 101. The protection film 81 is not necessarily required, so the anti-reflective coating 82*a* and resist film 82*b* may be formed directly on the inter-level insulating film 74.

Then, an etching process using the resist film 82*b* as an etching mask is performed to form a trench 78*b* in the inter-level insulating film 74 (Step S109 and FIG. 11, (*f*)). Then, an ashing process is performed to remove the resist film 82*b* and anti-reflective coating 82*a* (Step S110). The process of Step S110 may be performed by the denaturing units (VOS) 15*a* to 15*f*. In FIG. 11, (*f*), a reference symbol 79*b* denotes a damaged portion generated by the etching process of Step S109.

Then, a cleaning process is performed to remove polymer residues etc. generated by the preceding etching process and/or ashing process and the protection film 81 (Step S111). Further, a silylation process is performed to recover the damage of the damaged portion 79*b* of the inter-level insulating film 74 (Step S112 and FIG. 11, (*g*)). Also in this case, a silylation process may be performed after the etching of Step S109 and/or the ashing of Step S110.

Then, an etching process for removing the stopper film 73 and a process for removing residues are performed (Step S113). Thereafter, a silylation process is performed to recover the damage of damaged portions generated by the etching process or the like in the via-hole 78*a* and trench 78*b* (Step S114 and FIG. 11, (*h*)). FIG. 11, (*h*), shows a state after this silylation process.

Thereafter, a barrier metal film and a Cu seed layer are formed on the inner surface of the via-hole 78*a* and trench 78*b*. Then, a metal 76, such as copper, is embedded in the via-hole 78*a* and trench 78*b* to form a plug by electrolytic plating. Then, the wafer W is subjected to a heat process to perform an annealing process of the metal 76 embedded in the via-hole 78*a* and trench 78*b*. Then, a planarization process is performed on the wafer W by a CMP method (Step S115 and FIG. 11, (*i*)).

Figure 12:
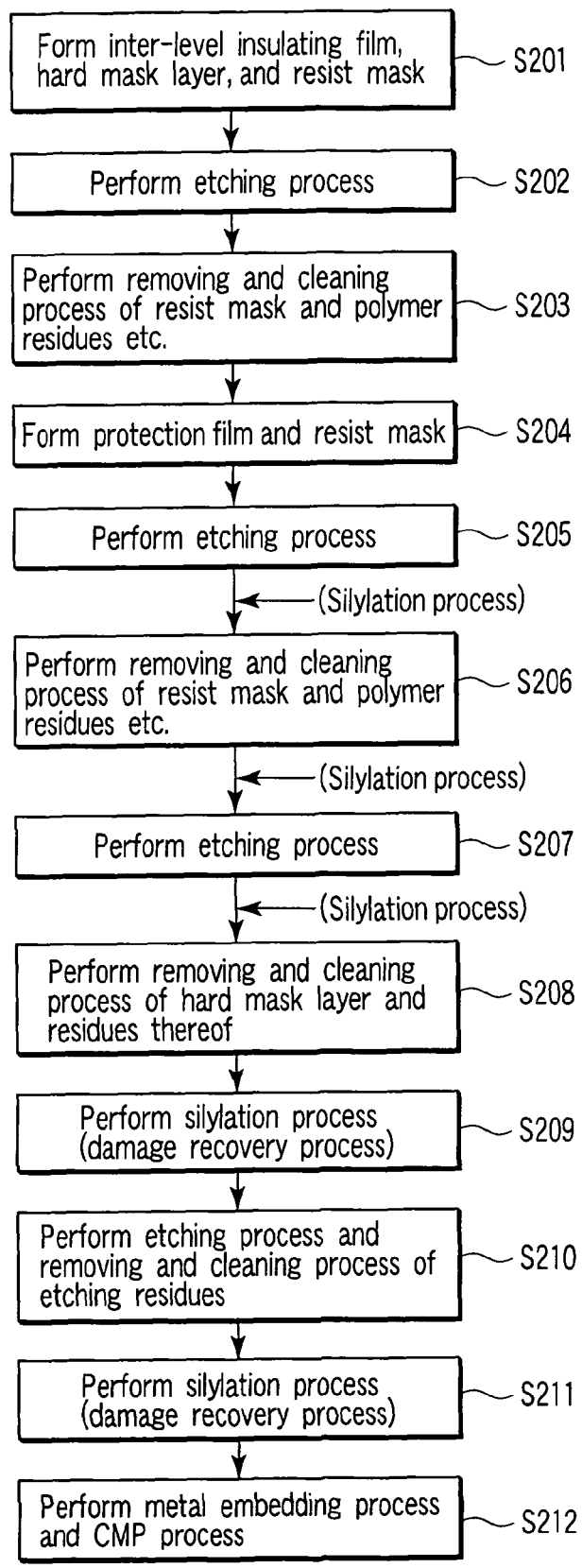
FIG. 12 is a flowchart showing another process for forming an interconnection structure by use of a dual damascene method.
Figure 13:
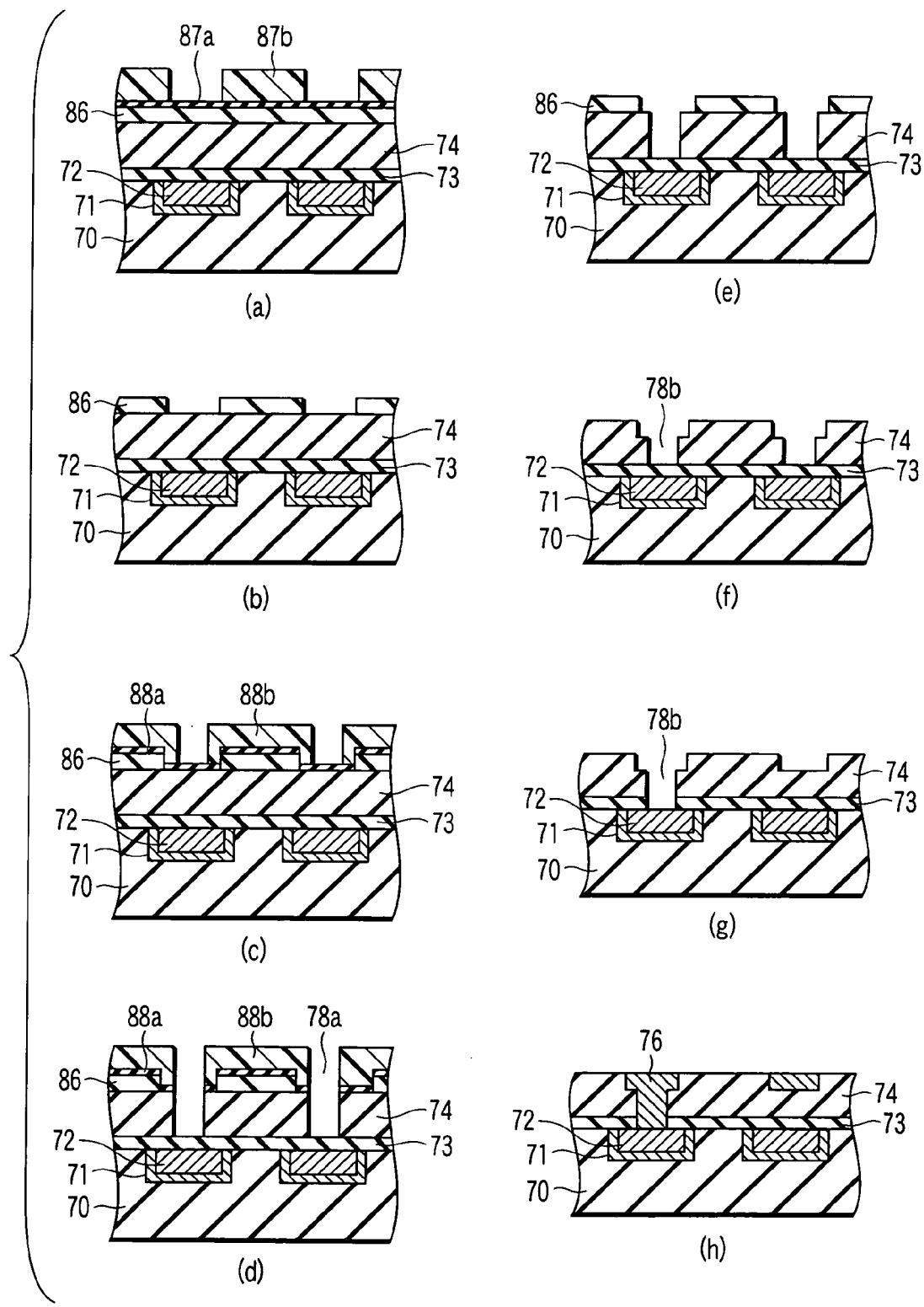
FIG. 13 comprises sectional views showing sequentially ordered steps of the process shown in FIG. 12.

FIG. 12 is a flowchart showing another process for forming an interconnection structure by use of a dual damascene method. FIG. 13 comprises sectional views showing sequentially ordered steps of the process shown in FIG. 12. Also for this process, the apparatuses used in the respective steps will not be explained, because they have been clarified by the preceding explanation.

At first, the following structure is prepared on a wafer W (the wafer W itself is not shown). Specifically, an insulating film 70 is disposed on the wafer W, in which a lower interconnection line (copper interconnection line) 72 is embedded with a barrier metal film 71 interposed therebetween, and a stopper film 73, such as an SiN film or SiC film, is disposed on the insulating film 70. The wafer W thus prepared is then provided with an inter-level insulating film 74, such as a Low-k film, a hard mask layer 86, an anti-reflective coating 87*a*, and a resist film 87*b* sequentially formed on the stopper film 73. Then, the resist film 87*b* is subjected to a light exposure process with a predetermined pattern, and then to a development process to form an etching pattern on the resist film 87*b* (Step S201 and FIG. 13, (*a*)).

Then, an etching process using the resist film 87*b* as an etching mask is performed to pattern the hard mask layer 86 (Step S202). Then, the resist film 87*b* and anti-reflective coating 87*a* are removed (Step S203 and FIG. 13, (*b*)). Then, an anti-reflective coating 88*a* and a resist film 88*b* are sequentially formed on the hard mask layer 86. Then, the resist film 88*b* is subjected to a light exposure process with a predetermined pattern, and then to a development process to form an etching pattern on the resist film 88b (Step S204 and FIG. 13, (c)).

Then, an etching process using the resist film 88b as an etching mask is performed to form a via-hole 78a reaching the stopper film 73 (Step S205 and FIG. 13, (d)). Then, an ashing process is performed to remove the resist film 88b and anti-reflective coating 88a, and a process for removing polymer residues etc. is performed (Step S206 and FIG. 13, (e)). If damaged portions are generated in the inter-level insulating film 74 by the etching process of Step S205, a silylation process may be performed before the ashing process. Further, if damaged portions are generated in the inter-level insulating film 74 by the ashing process and residue removing process of Step S206, a silylation process may be performed after this step.

After Step S206 is finished, the hard mask layer 86 with a predetermined pattern formed therein is exposed. Then, an etching process using the hard mask layer 86 as an etching mask is performed to form a trench 78b (Step S207). At this time, where damaged portions have been generated in the inter-level insulating film 74, a silylation process may be performed immediately thereafter. Then, an ashing process or chemical solution process is performed to remove the hard mask layer 86 (Step S208 and FIG. 13, (f)). For example, a silylation process is performed after the removing process of the hard mask layer 86 (Step S209), to recover the damage of damaged portions generated in the inter-level insulating film 74 before Step S208. FIG. 13, (f), shows a state after the damage recovery.

Then, an etching process for removing the stopper film 73 and a process for removing residues are performed (Step S210 and FIG. 13, (g)). Then, a silylation process is performed again to recover the damage of damaged portions (not shown) generated by the etching process or the like in the via-hole 78a and trench 78b (Step S211). Thereafter, a barrier metal film and a Cu seed layer are formed on the inner surface of the via-hole 78a and trench 78b. Then, a metal 76, such as copper, is embedded in the via-hole 78a and trench 78b to form a plug by electrolytic plating. Then, the wafer W is subjected to a heat process to perform an annealing process of the metal 76 embedded in the via-hole 78a and trench 78b. Then, a planarization process is performed on the wafer W by a CMP method (Step S212 and FIG. 13, (h)).

Table 1 shows results of an experiment in relation to a change in k-value where a silylation process was performed by the silylation units (SCH) 11a and 11b of the cleaning apparatus 104. In this experiment, a porous MSQ (Porous methyl-hydrogen-SilsesQuioxane) film is used as a low dielectric constant insulating film (low-k film). An etching process using an etching gas of $C_4F_8/Ar/N_2$ was performed by the etching units 51 and 52 of the etching apparatus 106. An ashing process using an ashing gas consisting solely of $O_2$ gas was performed by the ashing apparatus 105. Further, HMDS (Hexamethyldisilazane) was used as a silylation agent. The porous MSQ film is an insulating film (SOD film) formed by spin coating, which is a siloxane film having Si—O—Si bonds. The silylation process was performed at 2.5 Torr and 200° C. for 15 minutes.

TABLE 1

| Process state of test sample | k-value |
|---|---|
| Before etching process (after film formation) | 2.36 |

TABLE 1-continued

| Process state of test sample | k-value |
|---|---|
| After etching process/ashing process | 2.80 |
| After silylation process | 2.63 |

As shown in Table 1, the k-value was 2.36 before the etching, and it was increased to 2.80 after the etching process and ashing process. However, the k-value was decreased to 2.63 after the silylation process.

The silylation agent is not limited to a specific one, and this agent may comprise any substance as long as it causes a silylation reaction. However, it is preferable to use a substance having a relatively small molecular structure selected from the compounds including silazane bonds (Si—N bonds) in molecules, such as a substance having a molecular weight preferably of 260 or less, and more preferably of 170 or less. Namely, examples other than DMSDMA and HMDS are TMSDMA (Dimethylaminotrimethylsilane), TMDS (1,1,3,3-Tetramethyldisilazane), TMSPyrole (1-Trimethylsilylpyrole), BSTFA (N,O-Bis(trimethylsilyl)trifluoroacetamide), and BDMADMS (Bis(dimethylamino)dimethylsilane). The chemical structures of these substances are as follows.

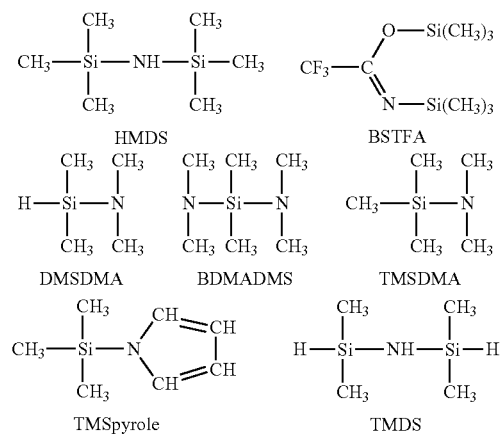

Of the compounds set out above, TMSDMA and TMDS are preferably used because they are high in the effect of recovering the dielectric constant, and the effect of decreasing the leakage current. Further, in light of the stability after silylation, it is preferable to use a substance (such as TMSDMA or HMDS) having a structure in which the Si of each silazane bond is bonded to three alkyl groups (such as methyl groups).

In the wafer processing system, the ashing apparatus 105 and etching apparatus 106 are separately formed. However, the etching units 51 and 52 of the etching apparatus 106 may be used to perform an ashing process, while using a different process gas. Further, if they are modified to supply a silylation agent, such as DMSDMA, they can perform a silylation process.

Figure 14:
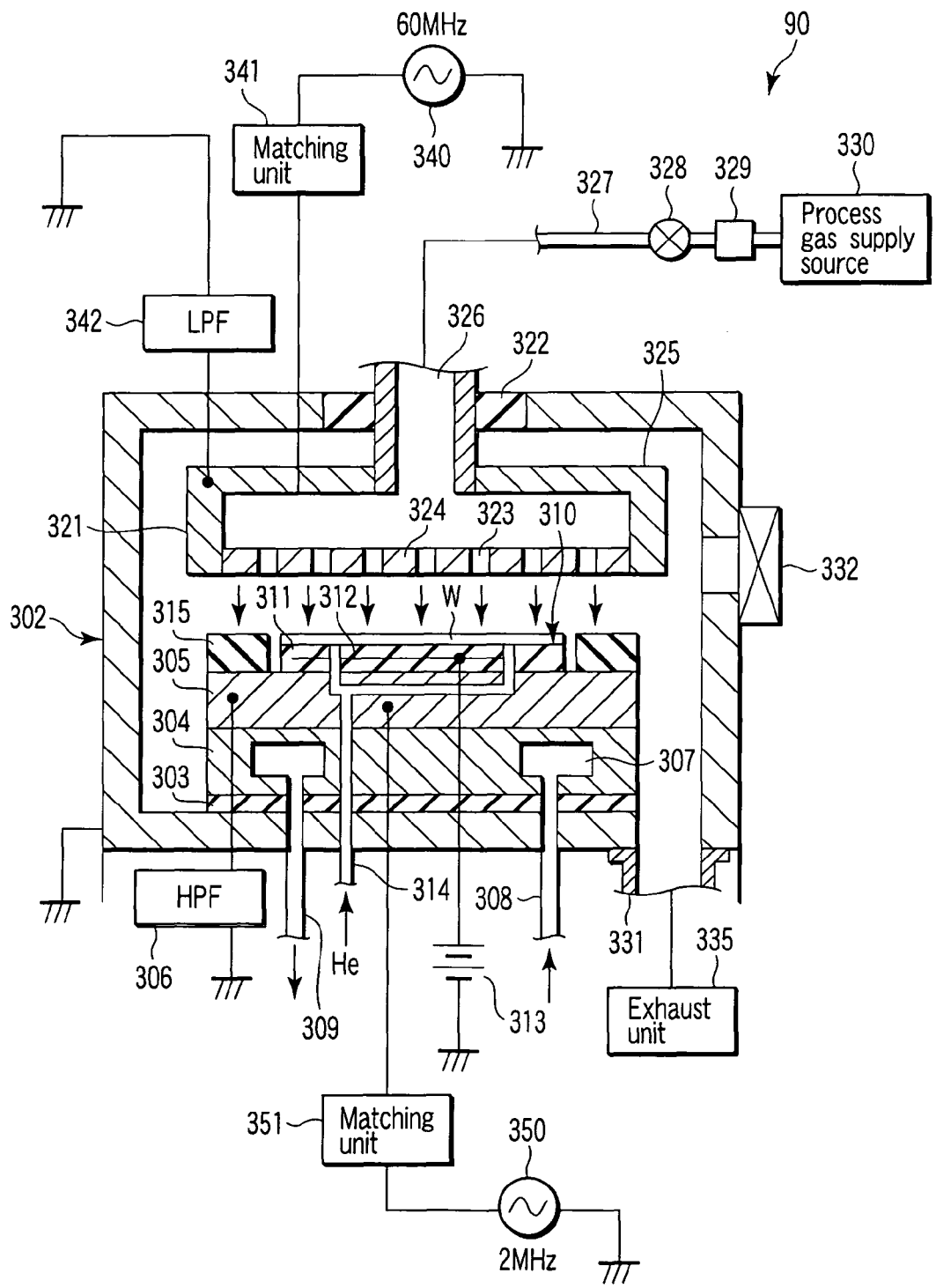
FIG. 14 is a sectional view schematically showing the structure of an etching unit.

FIG. 14 is a sectional view schematically showing the structure of an etching unit 90 which can perform an etching process, an ashing process, and a silylation process. This etching unit 90 may be disposed in the etching apparatus 106, in place of the etching units 51 and 52 and silylation units (SCH) 53 and 54 thereof shown in FIG. 6.

The etching unit 90 includes an essentially cylindrical plasma process chamber (plasma process container) 302. The plasma process chamber 302 is made of, e.g., aluminum with an anodization-processed (alumite-processed) surface and set at the ground potential.

The plasma process chamber 302 contains a susceptor pedestal 304 disposed therein on the bottom through an insulating plate 303, such as a ceramic. A susceptor 305 is disposed on the susceptor pedestal 304. The susceptor 305 is used as a lower electrode and has a top face, on which a wafer W is placed. A high-pass filter (HPF) 306 is connected to the susceptor 305.

The susceptor pedestal 304 is provided with a temperature adjusting medium space 307 formed therein. The temperature adjusting medium space 307 is connected to a supply line 308 and an exhaust line 309. A temperature adjusting medium is supplied through the supply line 308 into the temperature adjusting medium space 307. The temperature adjusting medium is circulated in the temperature adjusting medium space 307 and is exhausted from the exhaust line 309. Consequently, the susceptor 305 is adjusted to a predetermined temperature.

The susceptor 305 is formed of a circular plate having a projection at the center of the top, on which an electrostatic chuck 310 is disposed. The electrostatic chuck 310 has a structure in which an electrode 312 is sandwiched between insulating layers 311, and is connected to a DC (direct current) power supply 313. When a DC voltage of, e.g., about 1.5 kV is applied from the DC power supply 313 to the electrode 312, the wafer W is attracted and held on the electrostatic chuck 310 by an electrostatic force.

Further, a gas passage 314 is formed in the insulating plate 303, susceptor pedestal 304, susceptor 305, and electrostatic chuck 310 to supply a heat transmission medium (such as He gas) to the bottom of the wafer W. When the heat transmission medium is supplied through the gas passage 314, the temperature of the wafer W is adjusted to a predetermined value by heat transmitted through the heat transmission medium between the susceptor 305 and wafer W.

Where the wafer W is set at a high temperature in an ashing process or silylation process, the heat transmission medium is set for the high temperature. In the etching unit 90, however, when an etching process, ashing process, and/or silylation process are actually performed, it takes time to stabilize the temperature of the wafer W in changing the set temperatures for respective processes. For this purpose, a cooling element is preferably built in the susceptor 305 to control the temperature.

An annular focus ring 315 is disposed on the top of the susceptor 305 at the rim to surround the wafer W placed on the electrostatic chuck 310. The focus ring 315 is made of an insulative material, such as a ceramic or quartz, or a conductive material.

An upper electrode 321 is disposed above the susceptor 305 to face the susceptor 305 in parallel therewith. The upper electrode 321 is supported inside the plasma process chamber 302 through an insulating body 322. The upper electrode 321 includes an electrode plate 324, which defines a counter face opposite to the susceptor 305 and has a number of gas delivery holes 323, and an electrode support 325 supporting the electrode plate 324. The electrode plate 324 is made of an insulative material or dielectric material. In this embodiment, the electrode plate 324 is made of silicon. The electrode support 325 is made of a conductive material, such as aluminum with an anodization-processed (alumite-processed) surface. The distance between the susceptor 305 and upper electrode 321 is adjustable.

The electrode support 325 has a gas feed port 326 formed therein at the center, which is connected to a gas supply line 327. The gas supply line 327 is connected to a process gas supply source 330 through a valve 328 and a mass-flow controller 329.

A predetermined process gas for a plasma process is supplied from the process gas supply source 330. FIG. 14 shows only one process gas supply system comprising the gas supply line 327, valve 328, mass-flow controller 329, and process gas supply source 330, but a plurality of process gas supply systems are provided in practice. These process gas supply systems are arranged to supply gases, such as $O_2$ gas, $NH_3$ gas, $CO_2$ gas, Ar gas, $N_2$ gas, $CF_4$ gas, $C_4F_8$ gas, water vapor, and silylation agent, e.g., DMSDMA, into the plasma process chamber 302 at independently controlled flow rates.

The bottom of the plasma process chamber 302 is connected to an exhaust unit 335 through an exhaust line 331. The exhaust unit 335 includes a vacuum pump, such as a turbo molecular pump, to set the interior of the plasma process chamber 302 at a predetermined vacuum atmosphere (such as 0.57 Pa) or less.

The plasma process chamber 302 has a gate valve 332 on the sidewall. When the wafer W is loaded and unloaded to and from the plasma process chamber 302, the gate valve 332 is opened.

The upper electrode 321 is connected to a first RF (radio frequency) power supply 340 through a feed line provided with a first matching unit 341. The upper electrode 321 is further connected to a low-pass filter (LPF) 342. The first RF power supply 340 is arranged to supply an RF power with a high frequency of, e.g., 50 to 150 MHz for plasma generation. Where an RF power with such a high frequency is applied to the upper electrode 321, plasma can be generated with a high density and a preferable dissociation state within the plasma process chamber 302, so the plasma process can be performed under a low pressure condition. The frequency of the first RF power supply 340 is preferably set to be 50 to 150 MHz, and typically at or near 60 MHz, as shown in FIG. 14.

On the other hand, the lower electrode or susceptor 305 is connected to a second RF power supply 350 through a feed line provided with a second matching unit 351. The second RF power supply 350 is used for generating a self bias voltage and is arranged to supply a power with a frequency of, e.g., several hundred Hz to ten and several MHz, which is lower than that of the first RF power supply 340. Where a power with such a high frequency is applied to the susceptor 305, a suitable ion action can be applied to the wafer W without damaging it. The frequency of the second RF power supply 350 is typically set at, e.g., 2 MHz, as shown in FIG. 14, or alternatively at 3.2 MHz or 13.56 MHz.

Figure 15:
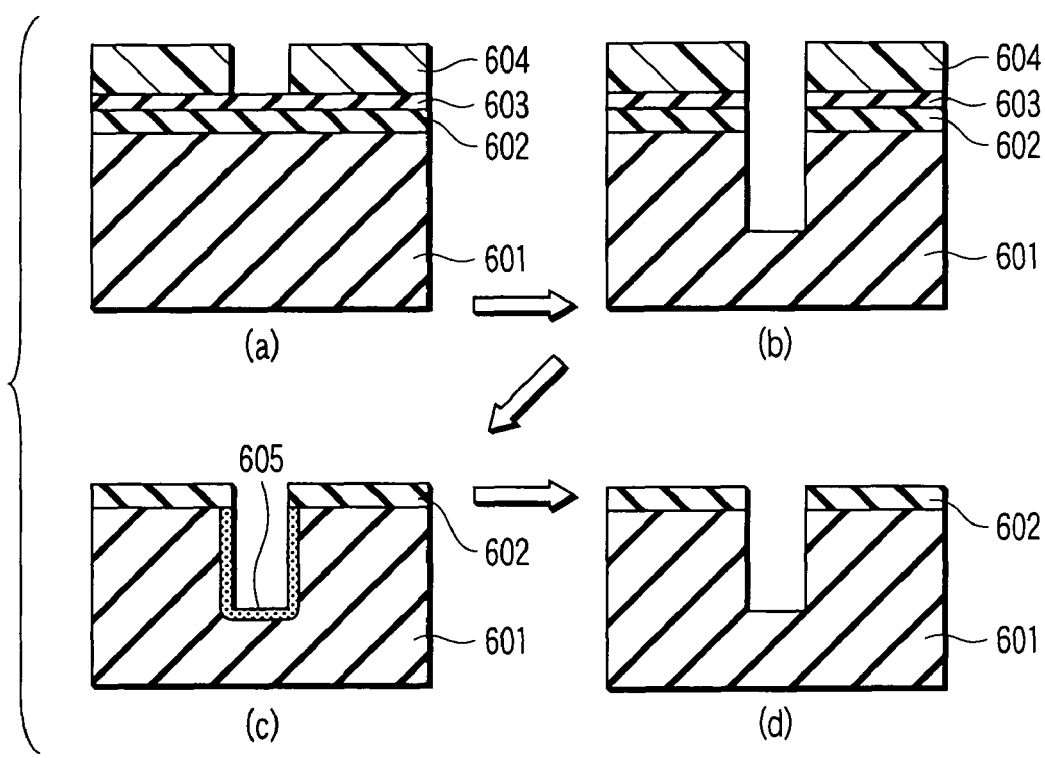
FIG. 15 comprises sectional views showing the surface structure of a wafer obtained in steps of a process using the etching unit shown in FIG. 14.

Next, an explanation will be given of steps of a process performed on a wafer W in the etching unit 90 described above. FIG. 15 comprises sectional views showing the surface structure of a wafer obtained in steps of a process using the etching unit shown in FIG. 14. As shown in FIG. 15, (a), on a wafer W (not shown), an organic low dielectric constant film (such as Porous MSQ) 601, an SiCN film 602, an anti-reflective coating (BARC) 603, and a resist film 604 are disposed in this order from below. The resist film 604 is already patterned.

At first, the gate valve 332 is opened, and a wafer W is transferred into the plasma process chamber 302 and is placed on the susceptor 305 by the blade 64a (or 64b) of the wafer transfer unit 62. Then, a DC voltage of, e.g., about 1.5 kV is applied from the DC power supply 313 to the electrode 312 of the electrostatic chuck 310, so that the wafer W is attracted and held on the electrostatic chuck 310 by an electrostatic force. Then, the blade 64a of the wafer transfer unit 62 is retreated from the plasma process chamber 302.

After the gate valve 332 is closed, the interior of the plasma process chamber 302 is exhausted and set at a predetermined vacuum level (such as 4 Pa or less) by the exhaust unit 335. Further, a predetermined process gas (such as $CF_4$ gas solely) is supplied at a predetermined flow rate from the process gas supply source 330 through the mass-flow controller 329 into the plasma process chamber 302. Furthermore, an RF power set at a predetermined level with a high frequency (such as 60 MHz) for plasma generation is applied from the first RF power supply 340 to the upper electrode 321. Under these conditions, plasma of the process gas is generated. At this time, an RF power set at a predetermined level with a low frequency (such as 2 MHz) for self bias voltage generation is applied from the second RF power supply 350 to the lower electrode or susceptor 305. With this RF power, ions in plasma are attracted onto the wafer W to subject the anti-reflective coating 603 to an etching process using the resist film 604 as an etching mask.

Then, the SiCN film 602 and organic low dielectric constant film 601 are sequentially subjected to etching processes using the same procedures of the etching process for the anti-reflective coating 603, but using different process gases, so that the structure shown in FIG. 15, (b), is obtained. For example, the SiCN film 602 is etched by plasma of a mixture gas of $C_4F_8/Ar/N_2$. The organic low dielectric constant film 601 is etched by plasma of a mixture gas of $CF_4/Ar$. Then, using the same procedures of the etching process, but using a process gas, such as $O_2$ gas, $NH_3$ gas, or $CO_2$ gas, an ashing process is performed by plasma of the process gas to remove the resist film 604 and anti-reflective coating 603. Consequently, the structure shown in FIG. 15, (d), is obtained. In FIG. 15, (c), damaged portions generated by the etching process and/or ashing process are schematically indicated by a reference symbol 605.

As described above, where the etching process and ashing process are sequentially performed, it is preferable to perform so-called two-step ashing. Specifically, in the firs step, cleaning for the interior of plasma process chamber 302 is performed without a bias voltage applied from the second RF power supply 350. Then, in the second step, an ashing process is performed on the wafer W with a bias voltage applied from the second RF power supply 350.

Then, while the pressure inside the plasma process chamber 302 is set at a predetermined vacuum level, a predetermined amount of water vapor is supplied through the delivery holes 323 formed in the upper electrode 321 into the plasma process chamber 302. Consequently, a suitable amount of moisture is adsorbed on the damaged portions generated by the etching process and ashing process in the organic low dielectric constant film 601.

Then, the interior of the plasma process chamber 302 is exhausted, and then stops being exhausted when the interior of the plasma process chamber 302 reaches a predetermined vacuum level. Then, while the interior of the plasma process chamber 302 is maintained at the predetermined vacuum level, the wafer W is heated to a temperature of, e.g., 50 to 200° C. that can cause a silylation reaction to start. Thereafter, a predetermined amount of silylation agent gas, such as DMSDMA gas, is supplied through the delivery holes 323 formed in the upper electrode 321 into the plasma process chamber 302. The silylation agent gas is supplied to increase the pressure inside the plasma process chamber 302, which is then maintained for a predetermined time. Consequently, as shown in FIG. 15, (d), the silylation process recovers the damage of the damaged portions 605 of the organic low dielectric constant film 601. After the silylation process, even if the wafer W thus treated is exposed to the atmosphere (air), the organic low dielectric constant film 601 scarcely absorbs moisture, thereby maintaining the property.

In FIG. 15, (d), in order to schematically show the recovery of the damaged portions 605, the structure of the organic low dielectric constant film 601 is shown such that the damaged portions 605 have been returned to the original state. However, after the damaged portions 605 are recovered, the chemical structure is not necessarily the same as the chemical structure of the organic low dielectric constant film 601.

The recovery of damage by the silylation process in the organic low dielectric constant film 601 can be quantitatively assessed by performing a hydrofluoric acid immersing process on the wafer W. This is so because, for example, the sidewall of the groove pattern of the organic low dielectric constant film 601 is changed to $SiO_2$ by the ashing process using oxygen plasma. If the damage is not recovered, $SiO_2$ is dissolved by hydrofluoric acid, and the organic low dielectric constant film 601 suffers side etching.

FIG. 16A comprises sectional views showing a change in the shape of a groove caused by a hydrofluoric acid immersing process where the groove has not been treated by the silylation process. FIG. 16B comprises sectional views showing a change in the shape of a groove caused by a hydrofluoric acid immersing process where the groove has been treated by the silylation process. In other words, these drawings show a difference between the presence and absence of the silylation process performed on the state shown in FIG. 15, (c), to obtain the state shown in FIG. 15, (d), before the hydrofluoric acid (hydrofluoric acid aqueous solution) immersing process. As shown in FIG. 16A, where the silylation process is not performed before the hydrofluoric acid process, $SiO_2$ generated by the ashing process is dissolved by the hydrofluoric acid. In this case, the organic low dielectric constant film 601 suffers side etching and the line width is thereby decreased. On the other hand, as shown in FIG. 16B, where the silylation process is performed, no $SiO_2$ is exposed on the sidewall of the groove pattern, and the corrosion resistance relative to hydrofluoric acid is improved. In this case, the organic low dielectric constant film 601 is prevented from suffering side etching due to the hydrofluoric acid.

Next, an explanation will be given of results of tests conducted to confirm effects of the present invention.

Figure 17A:
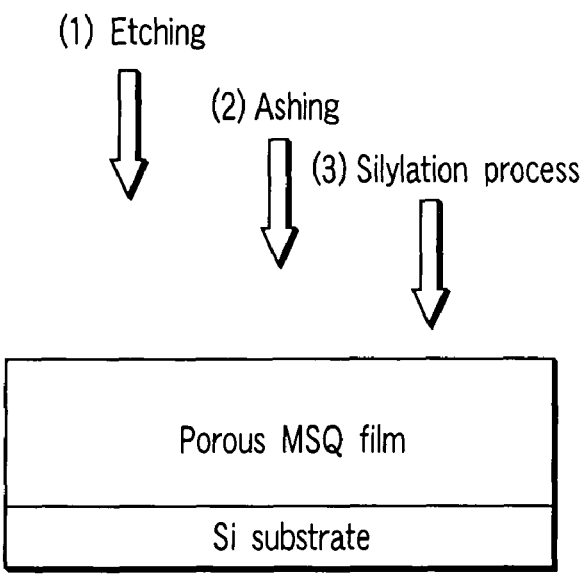
FIG. 17A is a side view showing a step of processing a test sample for measuring dielectric constant, leakage current density, and moisture desorption amount.
Figure 17B:
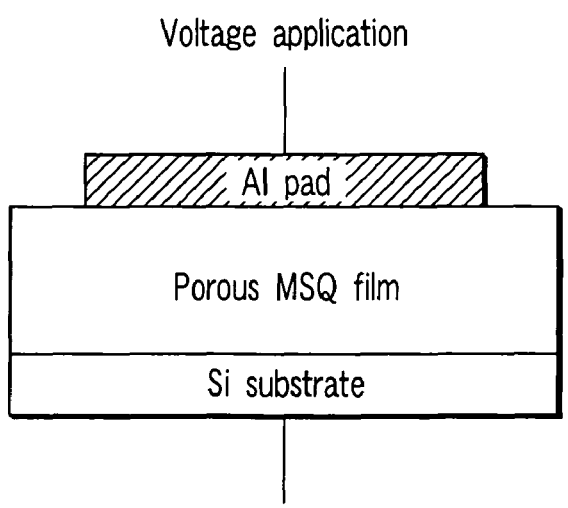
FIG. 17B is a side view showing a test sample for measuring dielectric constant, leakage current density, and moisture desorption amount.

(1) Measurement of dielectric constant, leakage current density, and water content:

FIG. 17A is a side view showing a step of processing a test sample for measuring dielectric constant, leakage current density, and moisture desorption amount. FIG. 17B is a side view showing a test sample for measuring dielectric constant, leakage current density, and moisture desorption amount. Specifically, a test sample was prepared by forming a porous MSQ film as an SOD film on an Si substrate. Then, an etching process and an ashing process were sequentially performed on the test sample to damage the porous MSQ film. Then, a silylation process using a silylation agent shown in Table 2 was performed, and then the dielectric constant and leakage current density of the film were measured. Further, without performing the silylation process, the dielectric constant and leakage current density of the film were measured.

Both of the etching process and ashing process were performed in the etching unit 90 shown in FIG. 14. In these processes, the etching gas was $CF_4$ and the ashing gas was $O_2$, $NH_3$, or $CO_2$. The silylation process was performed in a unit having the same structure as the silylation unit (SCH) 11a shown in FIG. 5. The silylation conditions were set differently in accordance with the type of silylation agent. For DMSDMA, the process temperature was set at 100° C. and the process time was set at 180 seconds. For TMSDMA, the process temperature was set at 150° C. and the process time was set at 150 seconds. For TMDS, the process temperature was set at 180° C. and the process time was set at 900 seconds. For BSTFA, BDMADMS, and TMSpytole, the process temperature was set at 180° C. and the process time was set at 300 seconds. The flow rate of $N_2$ gas (purge gas) was set at 5.0 L/min. The temperature of the vaporizer 43 was set at a suitable value within a range of a room temperature to 50° C. in accordance of the type of silylation agent. The flow rate of a silylation agent was set at a suitable value within a range of 0.1 to 1.0 g/mln in accordance of the type of silylation agent. The process pressure was set at a suitable value within a range of 666 to 9,5976 Pa (5 to 720 Torr) in accordance of the type of silylation agent.

In order to measure the dielectric constant and leakage current density, as shown in FIG. 17B, an Al pad was mounted on the porous MSQ film of the test sample, and the k-value and leakage current were measured while applying a voltage between the Si substrate and Al pad. Table 2 also shows results of this test. The leakage current density is expressed by a measurement value at 1 MV/cm, as a representative value.

TABLE 2

| Ashing gas | Silylation agent | Dielectric constant | | Leakage current density (A/cm²) @1 MV/cm |
|---|---|---|---|---|
| | | k-value | Recovery rate after ashing (%) | |
| | Before process | 2.47 | — | $3.28 \times 10^{-10}$ |
| | Etching process only | 3.25 | — | $1.13 \times 10^{-5}$ |
| $O_2$ | No silylation | 4.12 | — | $6.15 \times 10^{-5}$ |
| | DMSDMA | 3.16 | 58.1 | $5.47 \times 10^{-6}$ |
| | TMSDMA | 2.94 | 71.6 | $5.52 \times 10^{-7}$ |
| | TMDS | 2.89 | 74.8 | $1.80 \times 10^{-6}$ |
| | BSTFA | 3.14 | 59.6 | $8.90 \times 10^{-7}$ |
| | BDMADMS | 3.80 | 19.0 | $1.49 \times 10^{-5}$ |
| | TMSpyrole | 3.59 | 31.7 | $3.28 \times 10^{-5}$ |
| $NH_3$ | No silylation | 3.88 | — | $6.50 \times 10^{-5}$ |
| | DMSDMA | 3.43 | 31.8 | $1.40 \times 10^{-5}$ |
| | TMSDMA | 3.16 | 50.8 | $2.04 \times 10^{-6}$ |
| | TMDS | 3.22 | 47.0 | $1.04 \times 10^{-6}$ |
| | BSTFA | 3.61 | 19.1 | $5.29 \times 10^{-5}$ |
| | BDMADMS | 4.48 | −43.1 | $1.69 \times 10^{-4}$ |
| | TMSpyrole | 3.63 | 17.5 | $3.10 \times 10^{-5}$ |
| $CO_2$ | No silylation | 4.25 | — | $3.62 \times 10^{-5}$ |
| | DMSDMA | 3.39 | 48.2 | $1.19 \times 10^{-5}$ |
| | TMSDMA | 3.07 | 66.6 | $1.13 \times 10^{-6}$ |
| | TMDS | 3.22 | 57.6 | $5.31 \times 10^{-6}$ |
| | BSTFA | 3.42 | 46.6 | $2.92 \times 10^{-6}$ |
| | BDMADMS | 4.13 | 6.7 | $1.26 \times 10^{-5}$ |
| | TMSpyrole | 3.49 | 42.8 | $4.17 \times 10^{-5}$ |

As shown in Table 2, an increase in the k-value and an increase in the leakage current density were suppressed in a case where the silylation process was performed after the ashing process, as compared to a case where the silylation process was not performed. Particularly, TMSDMA and TMDS were good in the effect of recovering the k-value and the effect of decreasing the leakage current density. As regards the relationship relative to the type of an ashing gas, the silylation process was most effective for a case where $O_2$ gas was used for the ashing process.

Figure 18:
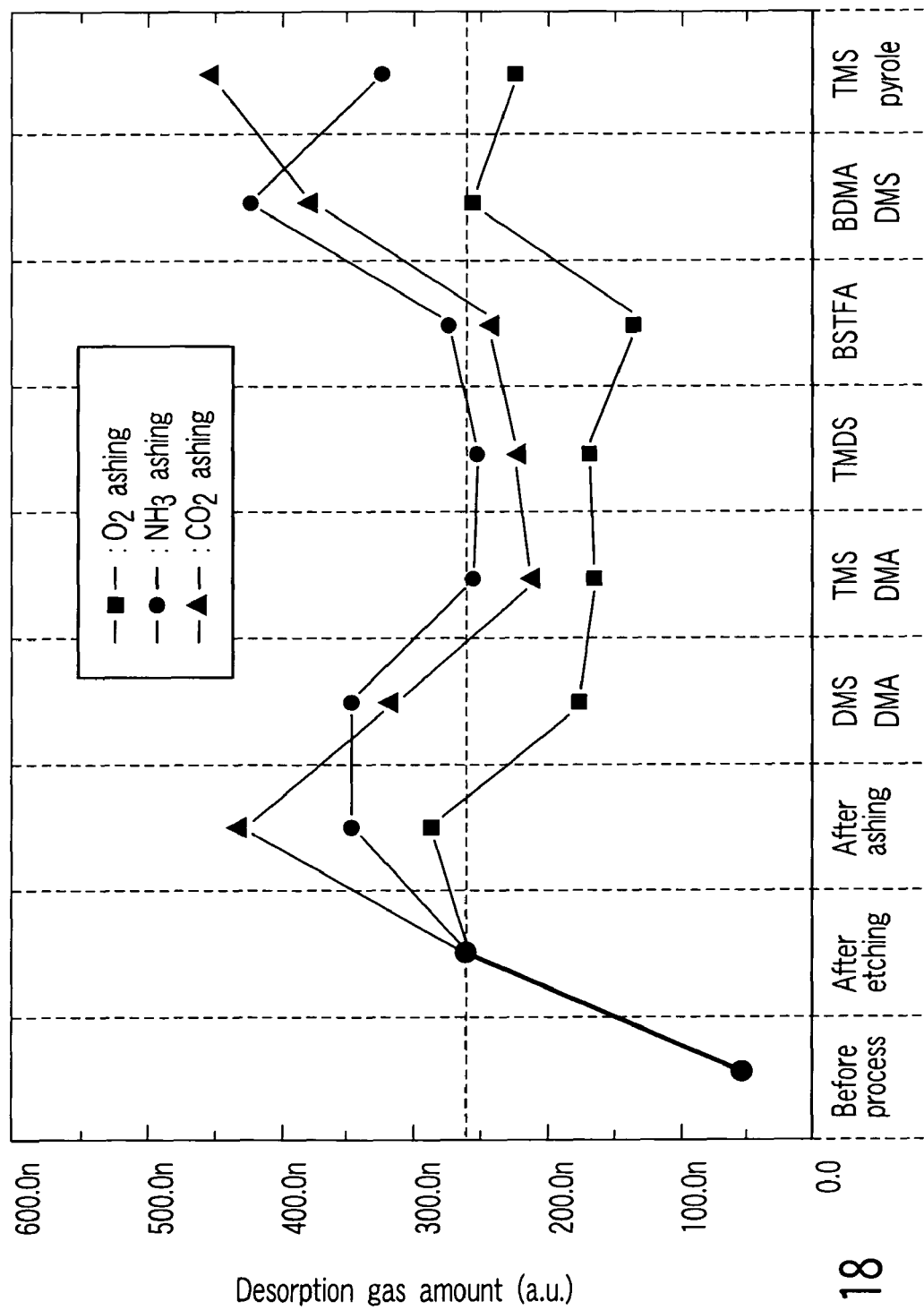
FIG. 18 is a graph showing how the moisture desorption amount changes depending on the presence and absence of a silylation process and the type of silylation agent.
Figure 20:
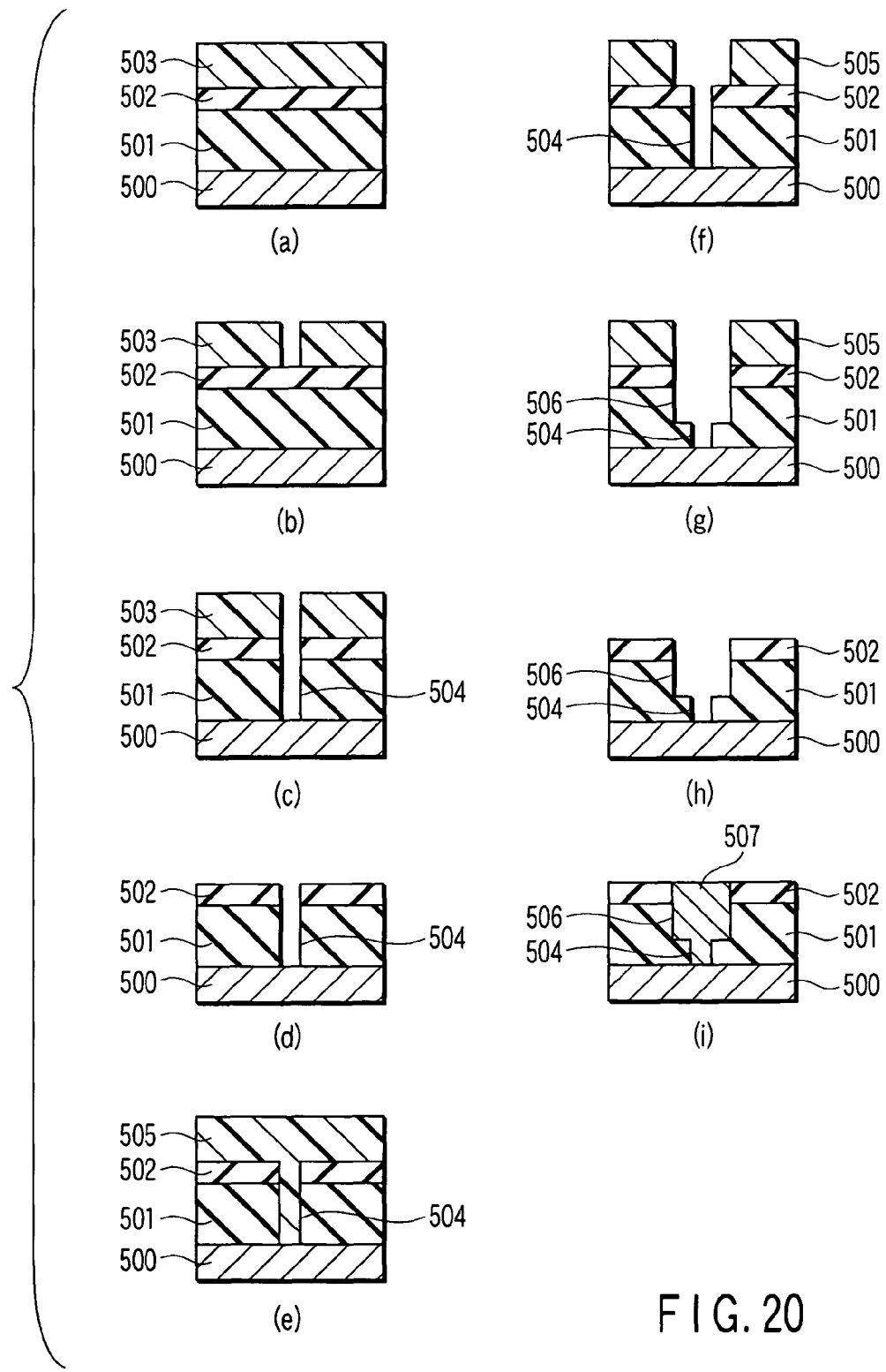
FIG. 20 comprises sectional views schematically showing sequentially ordered steps of a conventional process for forming an interconnection structure by use of a dual damascene method.

Further, a silylation process using one of various silylation agents was performed on a sample having the same structure shown in FIG. 17A. Then, the sample was heated at a heating-up rate of 1° C./second, and the moisture desorption amount thereof during this heating (i.e., the water content in the film) was measured by means of mass spectrometry. The water content in the film may deteriorate the dielectric constant and/or leakage current of the film. FIG. 18 is a graph showing how the moisture desorption amount changes depending on the presence and absence of the silylation process and the type of silylation agent. In FIG. 18, the vertical axis denotes a vale obtained where the moisture desorption amount (desorption gas amount) from 100 to 500° C. was subjected to integration by a unit of temperature and then normalized by the mass of the sample.

As shown in FIG. 18, the effect of decreasing the water content was good for $O_2$ ashing, without reference to the type of chemical solution. On the other hand, the effect of decreasing the water content was good for $NH_3$ ashing and $CO_2$ ashing, where TMSDMA or TMDS was used for the silylation process.

(2) Test of corrosion resistance relative to diluted hydrofluoric acid process:

FIG. 19A is a view showing a test sample before a corrosion resistance test using immersion in diluted hydrofluoric acid. FIG. 19B is a view showing the test sample after the corrosion resistance test using immersion in diluted hydrofluoric acid. Specifically, a test sample was prepared by forming a porous MSQ film as an SOD film on an Si substrate. Then, a mask film was formed thereon and subjected to light exposure and development to form a trench pattern by a photolithography technique. Then, an etching process using the mask pattern as an etching mask is performed on the porous MSQ film. Then, an ashing process using $O_2$, $NH_3$, or $CO_2$ as an ashing gas was performed to process residues of the etching mask. Then, a trench structure having a pattern shown in FIG. 19A was formed in the porous MSQ film.

Then, the test sample with this trench structure formed thereon was subjected to a silylation process using each of the silylation agents described above. Then, the test sample was subjected to an immersing process using 0.5%-diluted hydrofluoric acid for 30 seconds. Then, as shown in FIG. 19B, the trench width was measured on the upper and lower sides of the trench (which will be referred to as "top CD" and "bottom CD"). Table 3 shows a result of comparison between the present and absence of the silylation process before the diluted hydrofluoric acid process, in terms of an increased length in the top CD and an increased length in the bottom CD. The etching, ashing, and silylation processes were performed under the same conditions used in the test (1).

TABLE 3

| Ashing gas | Top CD/bottom CD (nm) after ashing | Silylation agent | Increase in top CD/bottom CD (nm) after diluted hydrofluoric acid process |
|---|---|---|---|
| $O_2$ | 220/197 | No silylation | 67/53 |
| | | DMSDMA | 6/7 |
| | | TMSDMA | 4/3 |
| | | TMDS | 23/13 |
| | | BSTFA | 7/4 |
| | | BDMADMS | 4/0 |
| | | TMSpyrole | 3/3 |
| $NH_3$ | 217/197 | No silylation | 73/53 |
| | | DMSDMA | 70/44 |
| | | TMSDMA | 80/50 |
| | | TMDS | 77/37 |
| | | BSTFA | 76/60 |
| | | BDMADMS | 23/0 |
| | | TMSpyrole | 27/27 |
| $CO_2$ | 223/197 | No silylation | 57/60 |
| | | DMSDMA | 7/3 |
| | | TMSDMA | 0/3 |
| | | TMDS | 17/17 |
| | | BSTFA | 13/17 |
| | | BDMADMS | 4/3 |
| | | TMSpyrole | 30/17 |

As shown in Table 3, an increase in CD was essentially suppressed and damage recovery was thus provided in a case where the silylation process was performed before the diluted hydrofluoric acid process, as compared to a case where the silylation process was not performed. Particularly, an increase in CD was remarkably suppressed where the silylation process was performed after $O_2$ ashing. Of the silylation agents, TMSDMA rendered a good damage recovery effect for both of $O_2$ ashing gas and $CO_2$ ashing gas.

The present invention has been explained with reference to the embodiments described above, but the present invention is not limited to the embodiments. For example, a film that can be subjected to a silylation process for damage recovery is not limited to the porous MSQ film described above. Alternatively, for example, an SiOC-based film, which is an inorganic insulating film formed by CVD, may be used. This film can be prepared from a conventional $SiO_2$ film by introducing methyl groups ($-CH_3$) into Si—O bonds present on the film to mix $S_1-CH_3$ bonds therewith. Black Diamond (Applied Materials Ltd.), Coral (Novellus Ltd.), and Aurora (ASM Ltd.) correspond to this type. An SiOC-based film of the porous type (with a lot of pores) may be used. An MSQ-based insulating film of a dense type, as well as a porous type, may be used.

Further, a process may be performed, as follows. Specifically, a via-hole and/or a trench are formed, and then a barrier metal film and a Cu seed layer are sequentially formed in the via-hole and/or trench. Then, copper is embedded in the via-hole and/or trench by electrolytic plating. Then, an annealing process and a CMP process are performed to form a copper interconnection line. Then, an ammonia plasma process is performed to subject the copper interconnection line surface to a de-oxidation process. Then, a stopper film is formed thereon. In this case, a silylation process may be performed to recovery the damage of damaged portions generated by the ammonia plasma process.

INDUSTRIAL APPLICABILITY

According to the present invention, in the process for forming an interconnection groove and/or a connection hole, the damage of damaged portions generated in an etching target film is recovered. Consequently, it is possible to improve electrical characteristics of the etching target, and to thereby manufacture a reliable semiconductor device.

The invention claimed is:

1. A semiconductor device manufacturing apparatus comprising:
an etching process section configured to perform an etching process using an etching gas on an etching target film disposed on a substrate, while using an etching mask having a circuit pattern and disposed on the etching target film, to form a groove or a hole in the etching target film;
an ashing process section configured to perform an ashing process using an ashing gas on the etching mask to remove the etching mask from the etching target film, after the etching process;
a silylation process section configured to perform a silylation process using a silylation agent gas on an inner surface of the groove or the hole of the etching target film to recover damages of the inner surface of the groove or hole inside a silylation chamber, the silylation process section being arranged to supply water vapor into the silylation chamber to have the inner surface of the groove or hole having the damages cause a reaction for absorbing moisture, which facilitates a silylation reaction; and
a control section configured to control an operation of the apparatus,
wherein the control section includes a non-transitory storage medium that stores a program for execution on a computer to control the apparatus, which, when executed, controls the apparatus to conduct a sequence that performs the etching process on the etching target film, the ashing process on the etching mask, and the reaction for absorbing moisture and the silylation process on the inner surface of the groove or hole of the etching target film, in this order.

2. The apparatus according to claim 1, wherein the silylation process section comprises:
a vacuum chamber configured to maintain a vacuum state therein and serving as the silylation chamber:
a vacuum-exhaust system connected to the vacuum chamber and provided with a pressure adjusting mechanism;
a gas supply system connected to the vacuum chamber and configured to supply the silylation agent gas into the vacuum chamber; and
a hot plate disposed inside the vacuum chamber and configured to control temperature of the substrate placed thereon.

3. The apparatus according to claim 1, wherein the ashing process section comprises a process gas supply system configured to supply, as the ashing gas, a gas including at least one of $O_2$ and $CO_2$.

4. The apparatus according to claim 1, wherein the etching process section, the ashing process section, and the silylation process section are connected to a transfer chamber configured to maintain a vacuum state therein and provided with a transfer mechanism therein, which transfers the substrate under a vacuum atmosphere among the etching process section, the ashing process section, and the silylation process section.

5. The apparatus according to claim 1, wherein the etching process section and the ashing process section comprise a process chamber and a process gas supply system configured to supply the etching gas and the ashing gas into the process chamber.

6. The apparatus according to claim 1, wherein the etching process section, the ashing process section, and the silylation process section comprise a process chamber and a process gas supply system configured to supply the etching gas, the ashing gas, and the silylation agent gas into the process chamber.

7. The apparatus according to claim 1, wherein the etching target film comprises a siloxane or SiOC-based material including alkyl groups as end groups.

8. The apparatus according to claim 1, wherein the silylation agent gas includes at least one of TMDS (1,1,3,3-Tetramethyldisilazane) and TMSDMA (Dimethylaminotrimethylsilane).

9. A semiconductor device manufacturing apparatus comprising:
an etching process section that uses an etching gas to perform an etching process on an etching target film disposed on a substrate;
an ashing process section that uses an ashing gas to perform an ashing process on an etching mask disposed on the etching target film;
a silylation process section that uses a silylation agent gas to perform a silylation process on the etching target film to recover damages of the etching target film inside a silylation chamber, the silylation process section being arranged to supply water vapor into the silylation chamber to have portions of the etching target film having the damages cause a reaction for absorbing moisture, which facilitates a silylation reaction; and a control section that controls an operation of the apparatus, wherein the control section includes a non-transitory storage medium that stores a program for execution on a computer to control the apparatus, which, when executed, controls the apparatus to conduct a sequence that comprises, operating the etching process section to perform the etching process using the etching gas on the etching target film, through a predetermined etching mask having a circuit pattern and disposed on the etching target film, to form a groove or a hole in the etching target film, operating the ashing process section to perform the ashing process using the ashing process on the predetermined etching mask to remove the predetermined etching mask from the etching target film, after the etching process, and operating the silylation process section to cause the reaction for absorbing moisture by use of the water vapor and perform the silylation process using the silylation agent on an inner surface of the groove or the hole of the etching target film to recover damages of the inner surface of the groove or the hole, after the ashing process.

10. The apparatus according to claim 9, wherein the silylation process section comprises:

a vacuum chamber configured to maintain a vacuum state therein and serving as the silylation chamber;

a vacuum-exhaust system connected to the vacuum chamber and equipped with a pressure adjusting mechanism;

a gas supply system connected to the vacuum chamber and configured to supply the silylation agent gas into the vacuum chamber; and a hot plate disposed inside the vacuum chamber and configured to control temperature of the substrate placed thereon.

11. The apparatus according to claim 9, wherein the etching process section is configured to etch, as the etching target film, a film comprising a siloxane or SiOC-based material including alkyl groups as end groups.

12. The apparatus according to claim 11, wherein the etching process section is configured to etch, as the etching target film, a MSQ (methyl-hydrogen-silsesquioxane) film.

13. The apparatus according to claim 11, wherein the silylation process section uses a gas, as a silylation agent gas, including at least one of TMDS (1,1,3,3-Tetramethyldisilazane) and TMSDMA (Dimethylaminotrimethylsilane).

14. The apparatus according to claim 9, wherein the ashing process section is configured to perform ashing on a mask, as the predetermined etching mask, including an SiCN film, an anti-reflective coating, and a resist film disposed in this order from below.

15. The apparatus according to claim 14, wherein the ashing process uses a gas, as the ashing gas, including at least one of $O_2$ and $CO_2$.

16. The apparatus according to claim 9, wherein the etching process section, the ashing process section, and the silylation process section are connected to a transfer chamber configured to maintain a vacuum state therein and equipped with a transfer mechanism therein, which transfers the substrate under a vacuum atmosphere among the etching process section, the ashing process section, and the silylation process section.

17. The apparatus according to claim 9, wherein the etching process section and the ashing process section comprise a common process chamber and a process gas supply system configured to selectively supply the etching gas and the ashing gas into the common process chamber.

18. The apparatus according to claim 9, wherein the etching process section, the ashing process section, and the silylation process section comprise a common process chamber and a process gas supply system configured to selectively supply the etching gas, the ashing gas, and the silylation gas into the common process chamber.

* * * * *